(12) United States Patent
Toda

(10) Patent No.: US 8,619,176 B2
(45) Date of Patent: Dec. 31, 2013

(54) SOLID STATE IMAGING DEVICE HAVING LENS AND MATERIAL WITH REFRACTIVE INDEX GREATER THAN 1 BETWEEN THE LENS AND IMAGING CHIP

(75) Inventor: Atsushi Toda, Kanagawa (JP)

(73) Assignee: Sony Corporation, Tokyo (JP)

( * ) Notice: Subject to any disclaimer, the term of this patent is extended or adjusted under 35 U.S.C. 154(b) by 391 days.

(21) Appl. No.: 12/635,521

(22) Filed: Dec. 10, 2009

(65) Prior Publication Data

US 2010/0171865 A1 Jul. 8, 2010

(30) Foreign Application Priority Data

Jan. 7, 2009 (JP) ................................. 2009-001996

(51) Int. Cl.
*H04N 5/225* (2006.01)

(52) U.S. Cl.
USPC .......................................... 348/340; 359/652

(58) Field of Classification Search
USPC .......................................... 348/340; 359/652
See application file for complete search history.

(56) References Cited

U.S. PATENT DOCUMENTS

| 6,753,905 B1* | 6/2004 | Okada et al. ............. 348/211.14 |
| 2004/0095502 A1* | 5/2004 | Losehand et al. ............. 348/340 |
| 2005/0018150 A1* | 1/2005 | Kamijima et al. ............. 353/100 |
| 2005/0068444 A1* | 3/2005 | Oshima et al. ................. 348/335 |
| 2010/0027121 A1 | 2/2010 | Takahara et al. |

FOREIGN PATENT DOCUMENTS

| JP | 61-049466 | 3/1986 |
| JP | 10-270672 | 10/1998 |
| JP | 2004-139035 | 5/2004 |
| JP | 2005-019573 | 1/2005 |
| JP | 2005-294749 | 10/2005 |
| JP | 2005-303148 | 10/2005 |
| JP | 2006-100515 | 4/2006 |
| JP | 2006-229110 | 8/2006 |
| JP | 2006-332347 | 12/2006 |
| JP | 2007-019435 | 1/2007 |
| JP | 2007-158179 | 6/2007 |
| JP | 2007-180208 | 7/2007 |
| JP | 2009-038352 | 2/2009 |
| JP | 2009-238940 | 10/2009 |

* cited by examiner

*Primary Examiner* — Usman Khan

(74) *Attorney, Agent, or Firm* — Robert J. Depke; The Chicago Technology Law Group, LLC

(57) ABSTRACT

A solid-state image-taking apparatus which have a solid-state image-taking device includes a chip of the solid-state image-taking device, an imaging lens configured to focus incoming light into an image on the solid-state image-taking device, and a material of a refraction index larger than 1, which is arranged between the chip and the imaging lens.

11 Claims, 26 Drawing Sheets

FIG. 22
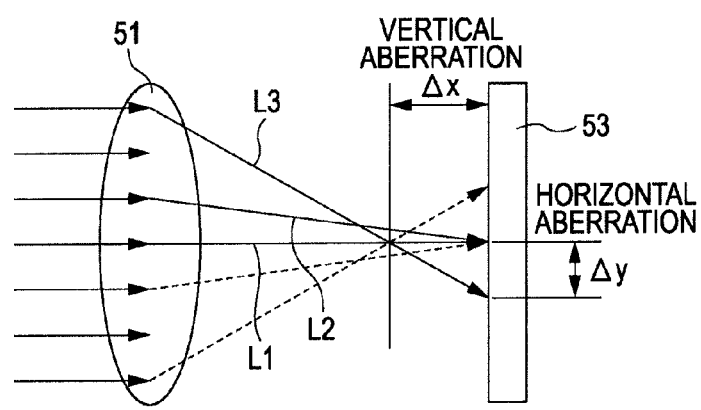
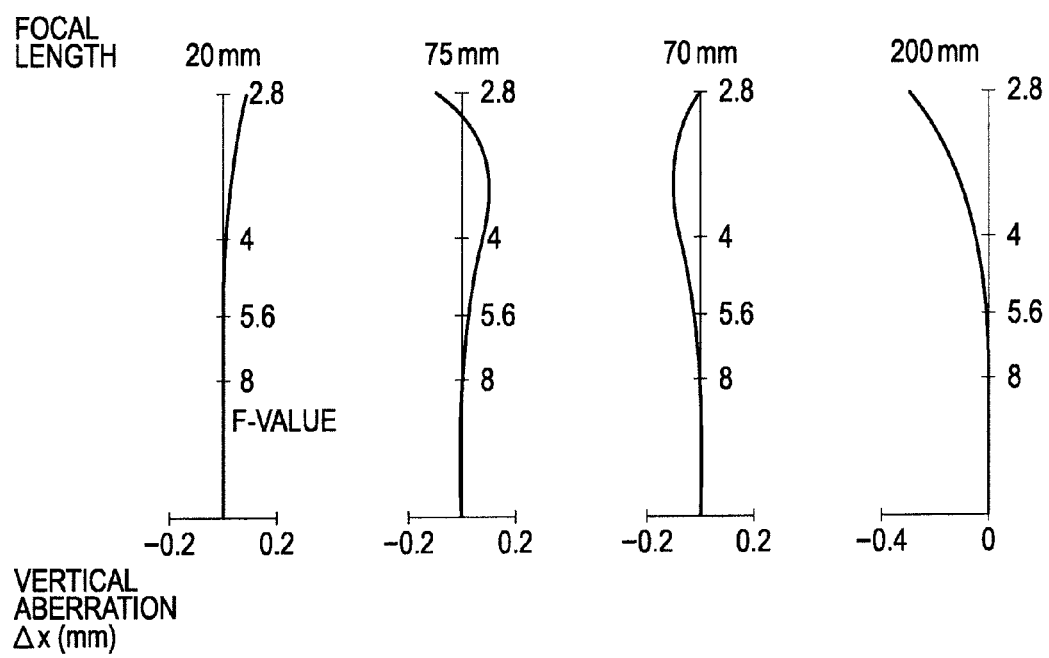
FIG. 23A  FIG. 23B  FIG. 23C  FIG. 23D

NA₀

NA₁

NA₁

$NA_0$ $NA_1$ $NA_1$

SOLID STATE IMAGING DEVICE HAVING LENS AND MATERIAL WITH REFRACTIVE INDEX GREATER THAN 1 BETWEEN THE LENS AND IMAGING CHIP

The present claims priority to Japanese Patent Application JP 2009-001996 filed in the Japan Patent Office on Jan. 7, 2009, the entire content of which is hereby incorporated by reference.

BACKGROUND OF THE INVENTION

1. Field of the Invention

The present invention relates to a solid-state image-taking apparatus including therein an imaging system lens and a chip of a solid-state image-taking device, further, a manufacturing method thereof, and a camera including therein the solid-state image-taking apparatus.

2. Description of the Related Art

Recently, in the field of solid-state image-taking devices, developments for miniaturization of pixels have been continuously performed.

Increasing the number of pixels included in a chip of a solid-state image-taking device results in enabling production of images of higher resolution.

Further, associated with the miniaturized pixels, in order that a sufficient amount of light rays can enter light receivers included in the pixels, configurations, in which an inner-layer lens or waveguide paths are provided, have been proposed (for example, refer to Japanese Unexamined Patent Application Publication No. 2006-332347, Japanese Unexamined Patent Application Publication No. 2005-294749 and Japanese Unexamined Patent Application Publication No. 2007-180208).

SUMMARY OF THE INVENTION

However, an advantage in that high resolution can be achieved, which is facilitated by the above-described methods, is obtained within a range where the resolution is lower than the resolution determined by the size of each of pixels inside the solid-state image-taking device. The resolution is also determined by a diffraction limit and aberration of an imaging lens, which are provided outside the solid-state image-taking device.

In an existing optical system including an imaging lens therein, which is used for each of existing solid-state image-taking apparatuses, there exist a diffraction limit and aberration, thus, even when light rays incoming from a point source of light are focused into an image by the imaging lens, a focal point of the image is of a certain width, and as a result, there is a limitation in increase of resolution of the existing solid-state image-taking apparatus.

Therefore, once reduction of the size of each of pixels included in a solid-state image-taking device reaches a certain degree, further reduction of the size thereof does not lead to a further increase of the resolution.

That is, in such an existing solid-state image-taking apparatus, which includes therein a solid-state image-taking device and an optical system having therein an imaging lens and the like, there is a limitation in further increase of resolution thereof by merely improving configurations of the solid-state image-taking device (a semiconductor chip) included therein.

Accordingly, it is preferable to provide a solid-state image-taking apparatus which enables realization of further increase of resolution thereof, a manufacturing method thereof, and a camera including therein the solid-state image-taking apparatus.

A solid-state image-taking apparatus according to an embodiment of the present invention includes a chip of a solid-state image-taking device, an imaging lens configured to focus incoming light into an image on the solid-state image-taking device, and a material of a refraction index larger than 1, which is arranged between the chip and the imaging lens.

A manufacturing method of a solid-state image-taking apparatus according to an embodiment of the present invention, which includes a chip of a solid-state image-taking device and an imaging lens configured to focus incoming light into an image on the solid-state image-taking device, includes formation of a material of a refraction index larger than 1 between the chip and the imaging lens.

A camera according to an embodiment of the present invention includes a solid-state image-taking apparatus having a solid-state image-taking device, and is used for taking an image, the solid-state image-taking apparatus being configured to be a solid-state image-taking apparatus according to an embodiment of the present invention.

The above-described solid-state image-taking apparatus according to an embodiment of the present invention is configured to include a material of a refraction index larger than 1, and this material changes a image-taking condition which causes the imaging lens to focus incoming light into an image on the solid-state image-taking elemental chip, and thus, enables further reduction of resolution (a minimum feature size that can be resolved).

The above-described manufacturing method of a solid-state image-taking apparatus according to an embodiment of the present invention includes a formation of a material of a refraction index larger than "1" between the chip and the imaging lens, and thus, enables manufacturing of a solid-state image-taking apparatus for which it is possible to further reduce resolution (a minimum feature size that can be resolved).

The above-described camera according to an embodiment of the present invention is configured to include a solid-state image-taking apparatus according to an embodiment of the present invention, and thus, it is possible to further reduce resolution (a minimum feature size that can be resolved), in the solid-state image-taking apparatus according to an embodiment of the present invention.

According to an embodiment of the present invention, it is possible to further reduce resolution (a minimum feature size that can be resolved), and thus, it is possible to provide a sold-state image-taking apparatus, which includes pixels each having a size the same as that of each of pixels included in an existing sold-state image-taking apparatus, and has resolution higher than that of the existing sold-state image-taking apparatus.

Accordingly, in a solid-state image-taking apparatus according to an embodiment of the present invention, it is possible to transcend the limitation of the resolution due to the diffraction limit and the aberration of the imaging lens, and as a result, obtain images of sufficiently high resolution in accordance with minuteness of individual pixels included therein.

Furthermore, in a solid-state image-taking apparatus according to an embodiment of the present invention, it is possible to realize high resolution regardless of an F-number of an imaging lens included therein.

BRIEF DESCRIPTION OF THE DRAWINGS

FIG. 22 is a diagram illustrating a phenomenon of spherical aberration;

FIGS. 23A to 23D are diagrams each illustrating a general aberration characteristic of a lens;

DESCRIPTION OF THE PREFERRED EMBODIMENTS

Hereinafter, preferred embodiments (which will be referred to as just embodiments below) according to the present invention will be described.

In addition, descriptions will be made in the following order.

1. An outline of embodiments according to the present invention

2. A first embodiment of a solid-state image-taking apparatus according to the present invention (a material of a large refraction index provided in a chip)

3. A second embodiment of a solid-state image-taking apparatus according to the present invention (utilization of near-field light; a spherical surface or a cylindrical surface)
4. A third embodiment of a solid-state image-taking apparatus according to the present invention (utilization of near-field light and light waveguide paths)
5. A fourth embodiment of a solid-state image-taking apparatus according to the present invention (lamination of a plurality of kinds of materials each having a large refraction index; reduction of chromatic aberration)
6. An example of a configuration of a circuit
7. An example of a modified solid-state image-taking apparatus according to the present invention
8. An embodiment of a camera according to the present invention 1. Outline of Embodiment According to Present Invention Firstly, prior to specific descriptions of embodiments according to the present invention, an outline of the embodiments will be described below.

It is a fundamental configuration of a solid-state image-taking apparatus according to embodiments of the present invention, which includes therein an imaging lens and a chip of a solid-state image-taking device, that the solid-state image-taking apparatus is provided with a material of a refraction index larger than 1 (for descriptive purposes, which will be hereinafter referred to as a high-refraction-index material) between the imaging lens and the chip.

With respect to an imaging system lens, due to a diffraction limit, even when light rays from a point source of light are focused into an image by the imaging system lens, practically, the focal point of the image results in an image area of a certain width. This image area of a certain width is called an airly disk.

Figure 18:
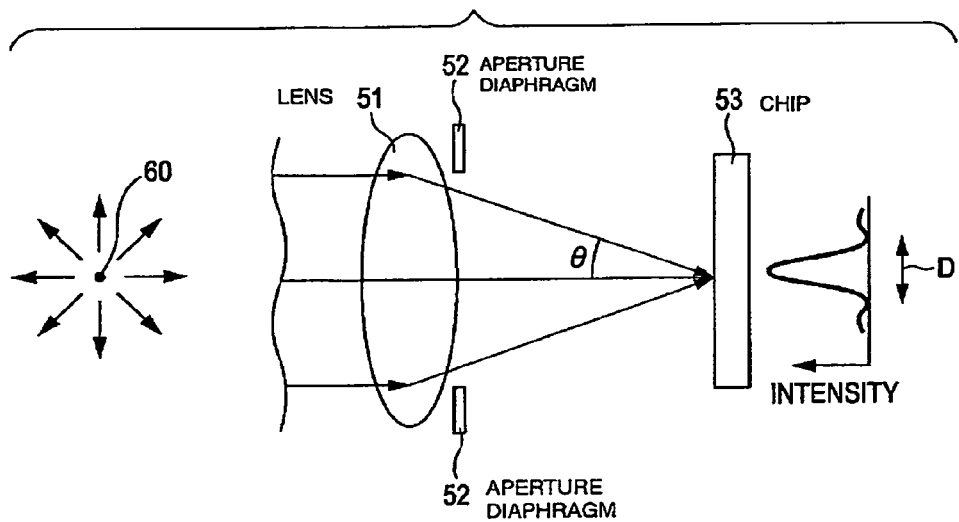
FIG. 18 is a diagram illustrating a phenomenon of a diffraction limit.

The diffraction limit will be described below with reference to FIG. 18. As shown in FIG. 18, a configuration, in which light rays originating from a point source of light 60 enter a solid-state image-taking apparatus including therein an imaging lens 51, an aperture diaphragm 52, and a chip 53 of a solid-state image-taking device, is assumed.

Light rays originating from the point source of light 60 are focused by the imaging lens 51, and the focused light rays pass through an aperture of the aperture diaphragm 52, and then, are produced into a focal point around on the surface of the chip 53. In such a configuration, an intensity distribution of light rays received on the chip 53 is shown at the right hand side of FIG. 18. As shown in this intensity distribution of the light rays, the light rays are focused into an image area having a circular shape of a diameter D, and this circular-shaped image area of a diameter D is the above-described airly disk.

The diameter D of the airly disk is represented by a formula as described below.

$$D = 1.22 \lambda / NA$$

Here, $\lambda$, is a wavelength of light rays, NA=$n^*\sin\theta$, n is a refraction index of the air, and $\theta$ is an incident angle of light rays.

Figure 19:
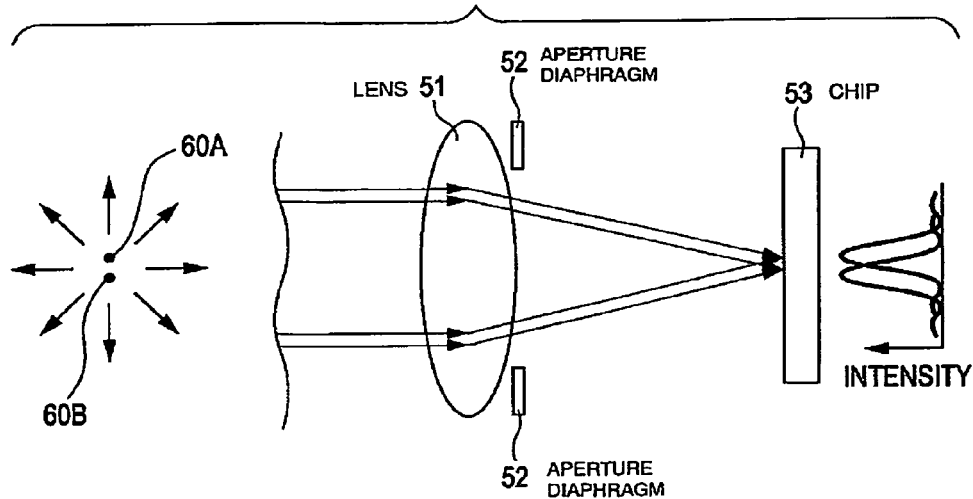
FIG. 19 is a diagram illustrating resolution (a minimum feature size that can be resolved) in the case where two point sources of light are located in the approximately same area.

Moreover, as shown in FIG. 19, a configuration, in which two point sources of light 60A and 60B are located in the approximately same area, is assumed.

In such a configuration, resolution (a minimum feature size that can be resolved) is determined by a degree of accuracy with which images focused by light rays originating from the two point resources of light 60A and 60B can be resolved as two images. In FIG. 19, in the same manner as that of FIG. 18, an intensity distribution of light rays received on the chip 53 is also shown at the right hand side.

As shown in FIG. 19, in the case where two point sources of light 60A and 60B are located nearby each other, a portion overlapped by two airly disks is generated, as seen in the light intensity distribution shown at the right hand side of FIG. 19. Depending on a degree of overlapping of the two airly disks, it is difficult to resolve two images as isolated images from the overlapped two airly disks, and as a result, the two images are likely to be resolved as one image.

In general, as a definition of the resolution (the minimum feature size that cab be resolved), there is the so-called Rayleigh limit. According to the Rayleigh limit, the size of a portion overlapped by the airly disks is regarded as the limitation of a size that can be resolved, and resolution (a minimum feature size that can be resolved) is represented by the following formula:

$$\omega = 0.61 \lambda / NA$$

Figure 20:
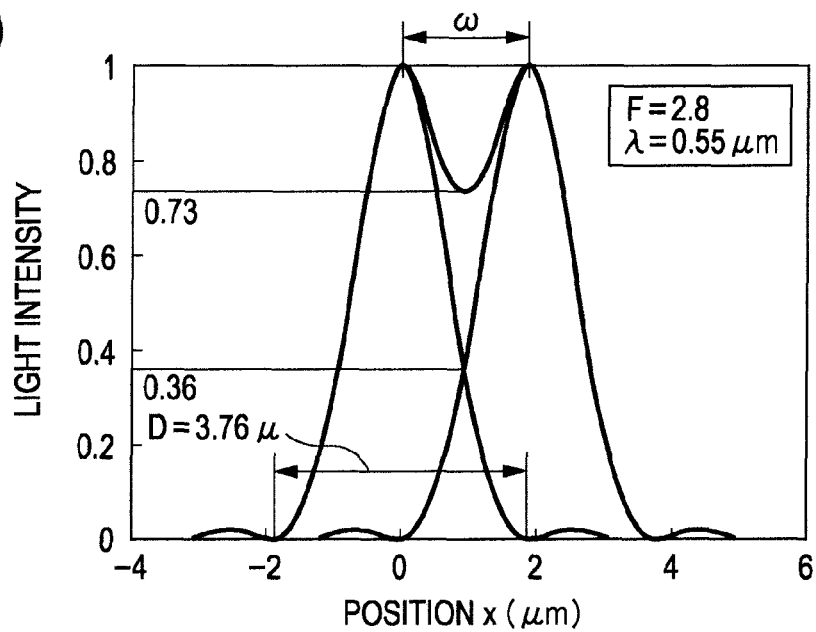
FIG. 20 is a diagram illustrating a relationship between a position x on a coordinate extending in the direction vertical to a light axis of incoming light rays and a light intensity of the incoming light rays.

Here, in the case where an F-value of the imaging lens 51 is 2.8, and a wavelength $\lambda$ of incoming light rays is 0.55 µm (550 nm), a relationship between a position x (µm) on a coordinate extending in the direction vertical to the light axis of incoming light rays and a light intensity (a relative value) is shown in FIG. 20. An original point on the coordinate representing the position x is a position corresponding to the position of the light axis of the incoming light rays originating from one of the two point sources of light.

In FIG. 20, in the case where F=2.8 and $\lambda$=0.55 µm, resolution $\omega$ (a minimum feature size $\omega$ that can be resolved) results in a value 1.88 µm, i.e., $\omega$=1.88 µm. In addition, here, the F-value is represented by the following formula: F=1/(2*NA).

Furthermore, in the case where the wavelength of incoming light rays is fixed as represented as follows: $\lambda$=0.55 µm, a relationship between the F-value and the resolution $\omega$ (the minimum feature size $\omega$ that can be resolved) is shown in FIG. 21A.

From the formulae $\omega$=0.61*$\lambda$/NA, and F=1/(2*NA), a formula: $\omega$=1.22*$\lambda$*F is derived, and it follows from this formula that, under the condition where the wavelength $\lambda$ is constant, resolution (a minimum feature size that can be resolved) is proportional to the F-value.

Figure 21A:
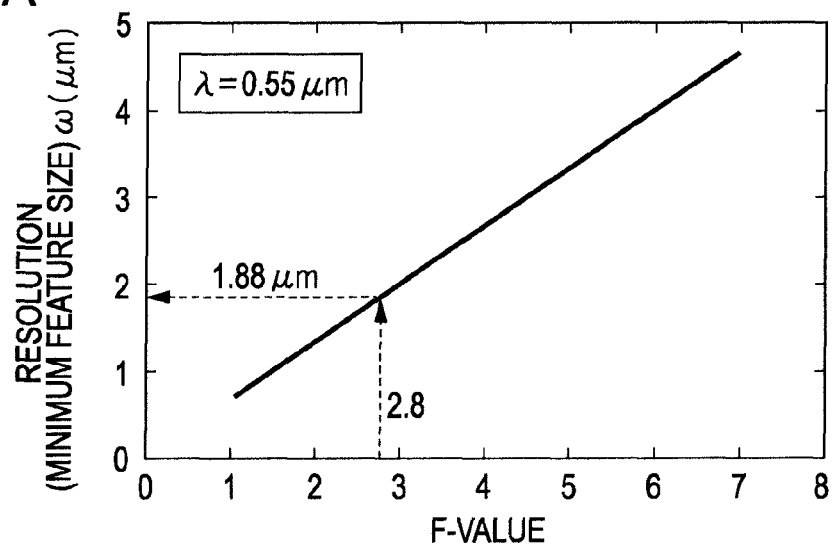
FIG. 21A is a diagram illustrating a relationship between an F-value of an imaging lens and resolution (a minimum feature size that can be resolved)

As shown in FIG. 21A, making the F-value to be smaller results in making the resolution (the minimum feature size that can be resolved) to be smaller, and thus, enables realization of a high resolution. In the case shown in FIG. 21A, it can be seen that, in the case where the F-value is approximately 2.8, the corresponding resolution (minimum feature size that can be resolved) is 1.88 µm.

Figure 21B:
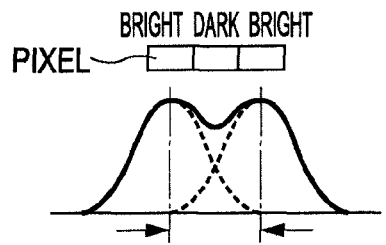
FIG. 21B is a diagram illustrating a relationship between resolution (a minimum feature size that can be resolved) and a size of a pixel.

Furthermore, according to the Nyquist's theorem, provided that a size of a pixel is half the size of resolution (the minimum feature size that can be resolved), it is possible to perform resolving up to the Rayleigh limit. That is, as shown in FIG. 21B, it follows that the size of a pixel, which is half the size of resolution (the minimum feature size that can be resolved), enables allocation of pixels so that each of pixels corresponds to a bright area or a dark area.

Therefore, in the case where an imaging lens having the F-value of 2.8 is used, a pixel having a size of 0.94 µm, which is half the size of resolution (the minimum feature size that can be resolved): 1.88 µl, enables resolving up to the Rayleigh limit. This means that, under the condition where the size of a pixel is less than or equal to 0.94 µm, making size of a pixel to be smaller does not lead to increasing of the resolution.

Hereinbefore, the diffraction limit has been described, however, in actual cases, there exists aberration with respect the imaging lens.

Spherical aberration will be described below with reference to FIG. 22.

As shown in FIG. 22, spherical aberration occurs due to a difference between a focal length of a light ray L1 passing through around the center portion of the imaging lens 51 and a focal length of a light ray L3 passing through the edge portion of the imaging lens 51. In the case shown in FIG. 22, there exist two kinds of aberration, one being horizontal aberration $\Delta y$ occurring in the direction perpendicular to the light axis of the incoming light rays, the other one being vertical aberration $\Delta x$ occurring in the direction parallel to the light axis of the incoming light rays, and it is the horizontal aberration $\Delta y$ shown in FIG. 22 that has an influence on the resolution.

In this case, an amount of out-of-focus $\epsilon_s$ is represented by a formula as follows: $\epsilon_s = \frac{1}{4} * \Delta y$.

Besides this spherical aberration, there exist also chromatic aberration, coma aberration, astigmatism, curvature of field, distortion and the like, and these make the resolution worse.

Further, the general characteristic of aberration with respect to a lens will be described below with reference to FIG. 23. In each of FIGS. 23A to 23D, the dependency of the vertical aberration $\Delta x$ on the F-value, which was described with reference to FIG. 22, is shown. Focal lengths in the cases of FIGS. 23A to 23D are different from one another, and the focal lengths are 20 mm, 75 mm, 70 mm and 200 mm in the cases of FIGS. 23A, 23B, 23C and 23D, respectively.

In each of the cases of FIGS. 23A to 23D, a tendency, in which, in the range of F<5.6, the aberration increases, can be seen.

The horizontal aberration $\Delta y$ and an amount of out-of-focus $\epsilon_s$, resulting from estimation from maximum vertical aberration $\Delta x$ with respect to each of the cases shown in FIGS. 23A to 23D, are as follows:

In the case of FIG. 23A (the focal length is 20 mm), the maximum vertical aberration $\Delta x = 0.1$ mm, the horizontal aberration $\Delta y = 17.9$ μm and the amount of out-of-focus $\epsilon_s = 4.5$ μm.

In the case of FIG. 23B (the focal length is 75 mm), the maximum vertical aberration $\Delta x = -0.1$ mm, the horizontal aberration $\Delta y = 17.9$ μm and the amount of out-of-focus $\epsilon_s = 4.5$ μm.

In the case of FIG. 23C (the focal length is 70 mm), the maximum vertical aberration $\Delta x = -0.1$ mm, the horizontal aberration $\Delta y = 17.9$ μm and an amount of out-of-focus $\epsilon_s = 4.5$ μm.

In the case of FIG. 23D (the focal length is 200 mm), the maximum vertical aberration $\Delta x = 0.3$ mm, the horizontal aberration $\Delta y = 53.5$ μm and the amount of out-of-focus $\epsilon_s = 13.4$ μm.

From the estimation results described above, it can be seen that each of the values of the amounts of out-of-focus $\epsilon_s$ is larger than the size of resolution (the minimum feature size that can be resolved), i.e., $\omega = 1.88$ μm in the case where F=2.8. From this analysis result, it follows that, in the range of F<5.6, a dominant factor which determines the resolution is the aberration of a lens rather than the diffraction limit thereof.

Taking into account current conditions with respect to the existing solid-state image-taking apparatuses, in embodiments according to the present invention, a configuration which will be described below is adopted.

That is, a material of a refraction index larger than that of the air (which is equal to "1"), i.e., a high-refraction-index material, is allocated in a space between a chip of a solid-state image-taking device and an imaging lens.

Figure 24A:
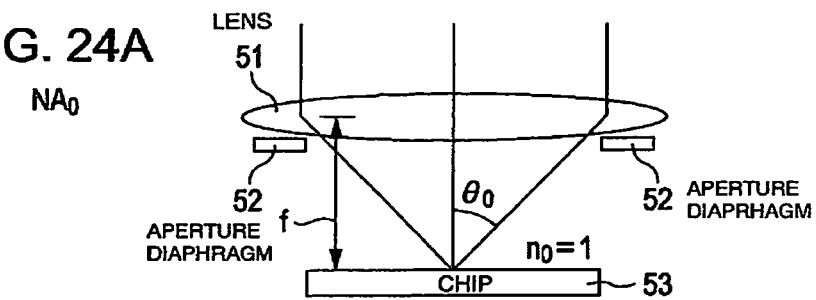
FIGS. 24A to 24C are diagrams for comparison illustrating an existing configuration and configurations according to embodiments of the present invention, in the case where an estimated angle from a lens of the existing configuration and an estimated angle of a lens of each of the configurations according to embodiments of the present invention are made to be equal.
Figure 24B:
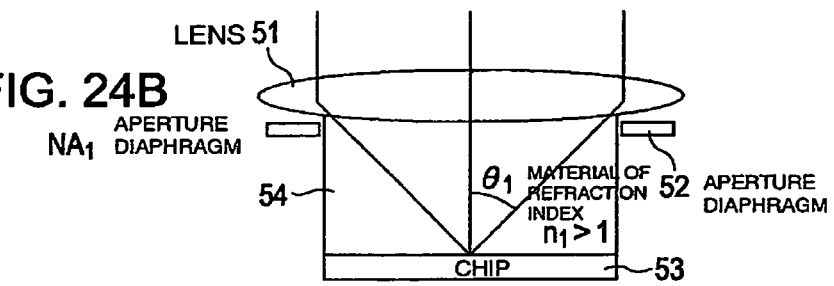

In the existing configuration, as shown in FIG. 24A, the air (whose refraction index $n_0=1$) exists between the imaging lens 51 and the chip 53. In contrast, for example, as shown in FIG. 24B, between the imaging lens 51 and the chip 53, a material 54 of a refraction index $n_1$ ($n_1>1$), which is larger than the refraction index $n_0$ of the air ($n_0=1$), is interposed. Providing such a configuration enables realization of a configuration which allows integration of the imaging lens 51 and the chip 53.

Further, in such a configuration as shown in FIG. 24B, in order to make a focal length to be equal to the focal length f of the existing configuration, an estimated angle $\theta_1$ from the imaging lens 51 is made to be equal to the estimated angle $\theta_0$ in the existing configuration (i.e., $\theta_1=\theta_0$).

Since the estimated angle $\theta_1$ from the imaging lens 51 is equal to the angle $\theta_0$ from the imaging lens 51 of the existing configuration, and further, the refection index $n_1$ is larger than the reflection index $n_0$ of the existing configuration, and as a result, NA is larger than that of the existing configuration, that is, a formula represented by $NA_1 > NA_0$ is satisfied. Here, since the resolution (the minimum feature size that can be resolved) is represented by the formula: $\omega = 0.61\lambda/NA$, the larger value of NA makes the resolution $\omega$ (the minimum feature size $\omega$ that can be resolved) due to the diffraction limit to be smaller.

Providing such a configuration leads to an advantage in that it is possible to obtain images of high resolution, and further, further reduce a limited reduced size of a pixel.

Figure 24C:
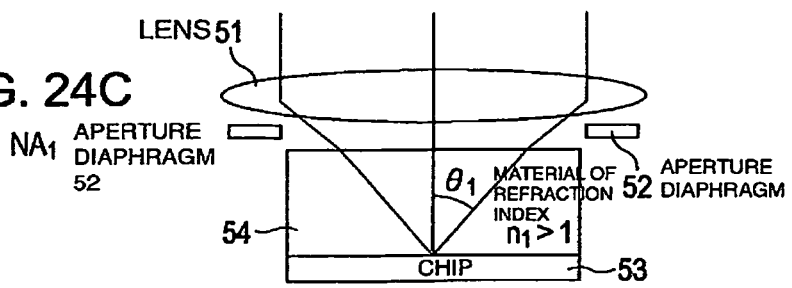

Moreover, in order to obtain the above-described effects, it is not necessary to provide a material of a refraction index larger than that of the air in the whole of a space between an imaging lens and a chip of a solid-state image sensing device. For example, as shown in FIG. 24C, it is possible to obtain effects the same as or similar to those in the case shown in FIG. 24B by providing a material 54 of a high refraction index in a part of a space between the imaging lens 51 and the chip 53 (at the chip 53 side of the space in the case shown in FIG. 24C).

Further, making the estimated angle $\theta_1$ from the imaging lens 51 in this embodiment to be smaller than the estimated angle $\theta_0$ of the existing configuration (i.e., $\theta_1<\theta_0$) so as to make $NA_1$ of this embodiment to be equal to $NA_o$ of the existing configuration leads to an advantage in that the spherical aberration of the existing configuration can be reduced.

Figure 25A:
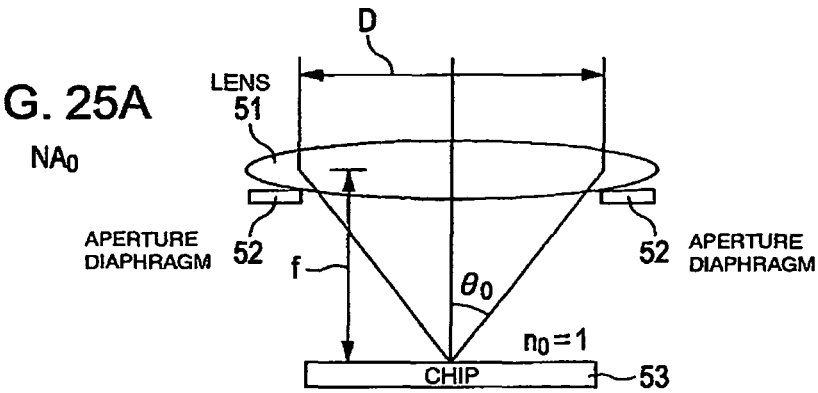
FIGS. 25A to 25C are diagrams for comparison illustrating an existing configuration and configurations according to embodiments of the present invention, in the case where an NA of the existing configuration and an NA of each of the configurations according to embodiments of the present invention are made to be equal.
Figure 25B:
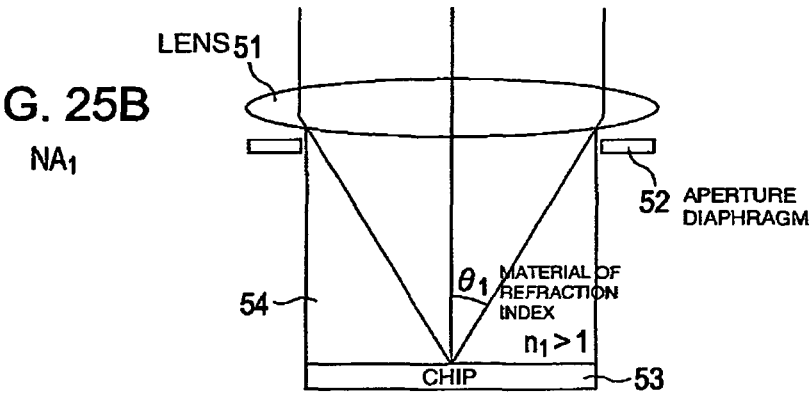
Figure 25C:
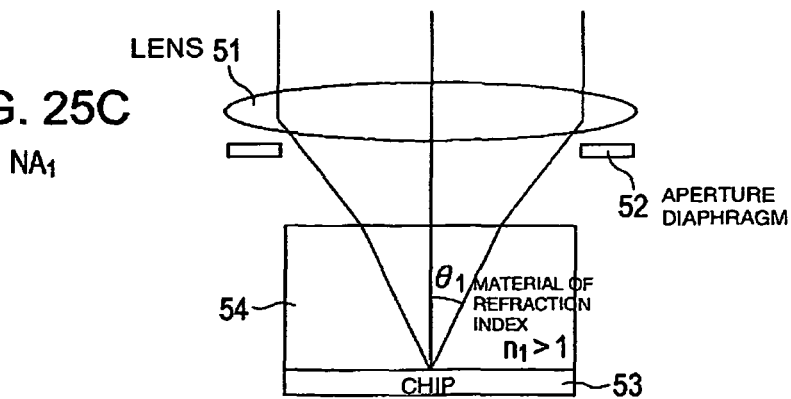

An outline of a configuration in such a case is shown in FIGS. 25B and 25C. In FIG. 25A, the existing configuration is shown just like in FIG. 24A. In FIG. 25B, a case where the whole of the space between the imaging lens 51 and the chip 53 is occupied by the material 41 of a high refraction index is shown just like the case shown in FIG. 24B. In FIG. 25C, a case where the material 54 of a high refraction index is interposed in a part of the space between the imaging lens 51 and the chip 53 (at the chip 53 side of the space) just like the case shown in FIG. 24C.

In each of the configurations shown in FIGS. 25B and 25C, the estimated angle $\theta_1$ from the imaging lens 51 is made to be smaller than the estimated angle $\theta_0$ of the existing configuration shown in FIG. 25A (i.e., $\theta_1<\theta_0$) so as to make $NA_1$ of the cases shown in FIGS. 25B and 25C to be equal to $NA_o$ of the existing configuration shown in FIG. 25A (i.e., $NA_o=NA_1$).

An amount of out-of-focus due to the spherical aberration can be represented by the following formula using a diameter D of the imaging lens 51, the estimated angle $\theta$ from the imaging lens 51 and the focal length f of the imaging lens 51:

$$\varepsilon = \frac{1}{4} \times \left( f \times \tan\theta - \frac{D}{2} \times \frac{\tan\theta}{\tan(\theta + \Delta\theta)} \right), \quad \text{(Number 1)}$$

$$\Delta\theta = -\frac{1}{6}\theta^3 + \frac{1}{120}\theta^5$$

From this formula, it can be understood that making the value of the estimated angle θ from the imaging lens to be smaller results in a smaller value of the amount of out-of-focus ε.

In addition, the F-value of the imaging lens 51 is obtained by using the following formula: F=f/D, wherein f and D are a focal length and a diameter of the imaging lens 51, respectively.

Subsequently, an estimated degree of an improvement achieved by the above-described configuration of this embodiment according to the present invention will be described below.

Firstly, under the condition where the estimated angle θ from an imaging lens of the solid-state image-taking apparatus according to this embodiment is equal to that of the existing solid-state image-taking apparatus (refer to FIG. 24), further, in the case where a material of a refraction index $n_1=1.6$ is laminated as the material 54 of a high refraction index, a relationship between the thickness d of the laminated material and resolution (a minimum feature size that can be resolved) due to the diffraction limit was estimated. In addition, here, the focal length of the imaging lens f is assumed as follows: f=5.6 cm. The result of the estimation, which has been made in the case where the F-value F and the diameter D of the imaging lens 51 are varied into three cases, the first one being F=5.6 and D=1.0 cm, the second one being F=4.2 and D=1.33 cm, the third one being F=2.8 and D=2.0 cm, is shown in FIG. 26.

In addition, in the case where d is 5.6 cm, since the depth of the laminated material is equal to the focal length f of the imaging lens 51, as a result, a space interposed between the imaging lens 51 and the chip 53 is entirely occupied by the high-refraction-index material.

Figure 26:
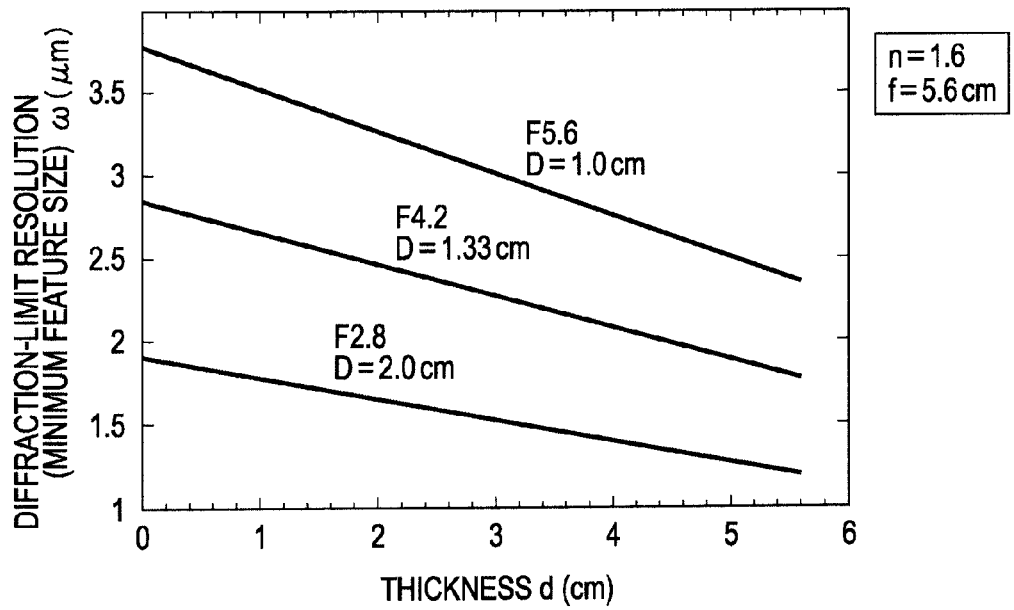
FIG. 26 is a diagram illustrating a relationship between a thickness of a laminated material and resolution (a minimum feature size that can be resolved) which is determined by a diffraction limit.

From a graph shown in FIG. 26, it can be understood that making the depth d of the laminated material to be larger results in reduction of the resolution ω (the minimum feature size ω that can be reduced). As a result, making the depth d of the laminated material to be larger leads to an advantage in that it is possible to obtain images of high resolution, and further reduce a limited reduced size of a pixel.

Next, under the condition where a spherical lens is used and the value of the NA is constant, further in the case where a material of a refraction index $n_1=1.6$ is laminated as the high-refraction-index material 54, an estimation of a relationship between the thickness d of the laminated material and an amount of out-of-focus ε was estimated. The F-value F and the diameter D of the imaging lens 51 are varied into three cases in the same manner as that of FIG. 26. The result of the estimation is shown in FIG. 27.

Figure 27:
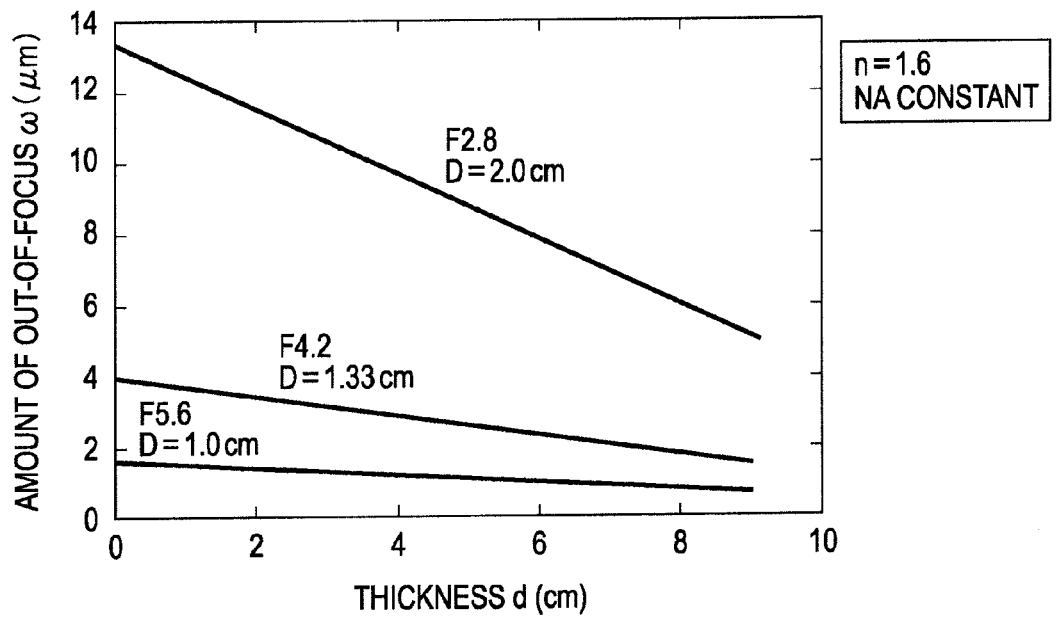
FIG. 27 is a diagram illustrating a relationship between a thickness of a laminated material and an amount of out-of-focus.

From a graph shown in FIG. 27, it can be understood that making the depth d of the laminated material to be larger results in reduction of an amount of out-of-focus ε. As a result, making the depth d of the laminated material to be larger leads to an advantage in that it is possible to obtain images of high resolution, and further reduce a limited reduced size of a pixel.

Next, the above-described improvement effects on the resolution (the minimum feature size that can be resolved) will be described on a conceptual basis with reference to FIG. 28.

Figure 28:
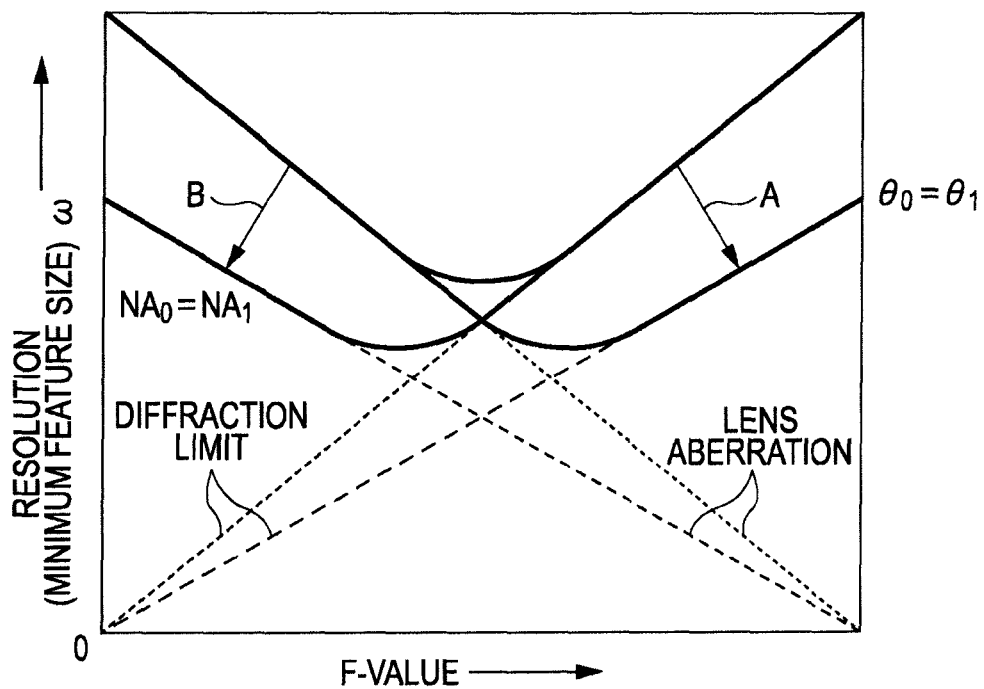
FIG. 28 is a diagram illustrating an improvement effect on resolution (a minimum feature size that can be resolved), according to embodiments of the present invention.

As shown in FIG. 28, the resolution (the minimum feature size that can be resolved), which is determined by an imaging lens, depends on the F-value of the imaging lens.

Under the condition where an estimated angle $\theta_1$ from the imaging lens in the configuration of this embodiment equals to an estimated angle $\theta_1$ in the existing configuration, that is, under the condition where formulae $\theta_0 = \theta_1$ and $NA_1 > NA_0$ are satisfied, within the range where the resolution (the minimum feature size that can be resolved) is mainly determined by the diffraction limit of the imaging lens, the improvement on the resolution (the minimum feature size that can be resolved) can be achieved in the configuration of this embodiment, as denoted by a variation indicated by an arrow A of FIG. 28.

Next, under the condition where $NA_1$ in the configuration of this embodiment equals to $NA_0$ in the existing configuration, that is, under the condition where formulae $NA_0 = NA_1$ and $\theta_1 < \theta_0$ are satisfied, within the range where the resolution (the minimum feature size that can be resolved) is mainly determined by the aberration of the imaging lens, such as the spherical aberration, the improvement on the resolution (the minimum feature size that can be resolved) can be achieved in the configuration of this embodiment, as denoted by a variation indicated by an arrow B of FIG. 28.

Accordingly, it follows from the above-described analysis that these improvement effects depend on the F-value of the imaging lens.

In order to averagely obtain the improvement effects for all values of the F-value, the values of NA and θ may be intermediate ones.

Figure 29:
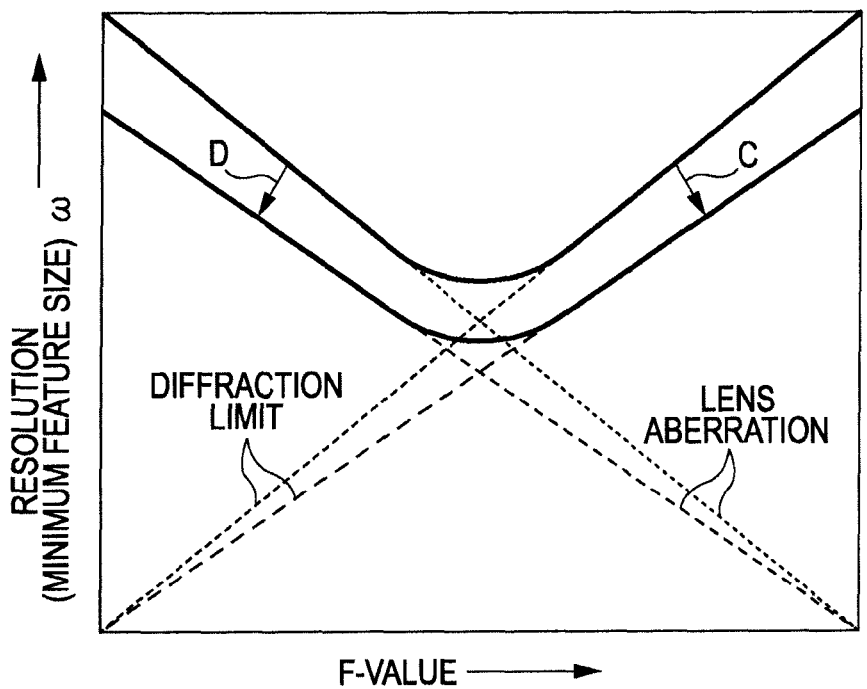
FIG. 29 is a diagram illustrating an improvement effect on resolution (a minimum feature size that can be resolved) in the case where values of an NA and an estimated angle from a lens are intermediate values.

That is, under the condition where formulae $NA_1 > NA_0$ and $\theta_1 < \theta_0$ are satisfied, it is also possible to obtain improvement effects. In this case, as shown in FIG. 29, the improvement on the resolution ω (the minimum feature size ω that can be resolved) can be achieved in the configuration of this embodiment, as denoted by variations indicated by arrows C and D.

The above-described results can be obtained regardless of the existence of an on-chip lens or an on-chip color filter.

In the case where an on-chip lens or an on-chip color filter exists on a solid-state image-taking device, a high-refraction-index material is formed on the on-chip lens or the on-chip color filter, that is, on the highest layer of the solid-state image-taking device.

In the case where no on-chip lens and on-chip color filter exists on a solid-state image-taking device, a high-refraction-index material is formed on a semiconductor layer including a silicon material or the like, in which light receivers are formed, or an insulating layer including a wiring layer.

In this embodiment, forming a high-refraction-index material between an imaging lens and a solid-state image-taking device leas to an advantage in that it is possible to further reduce resolution (a minimum feature size that can be resolved). For this reason, regardless of how the high-refraction-index material is laminated on the solid-state image-taking device, the advantage can be obtained.

For example, either of a method, in which the high-refraction-index material is laminated on the highest layer of the solid-state image-taking device, or a method, in which the highest layer of the solid-state image-taking device is laminated on the surface of a package sealing the solid-state image-taking device therein, leads to the advantage.

In addition, in the case where the high-refraction-index material is directly laminated on an on-chip lens, which is formed on the highest layer of the solid-state image-taking device, it is preferable to make a refraction index of the high-refraction-index material to be smaller than a refraction index of the on-chip lens.

Figure 30:
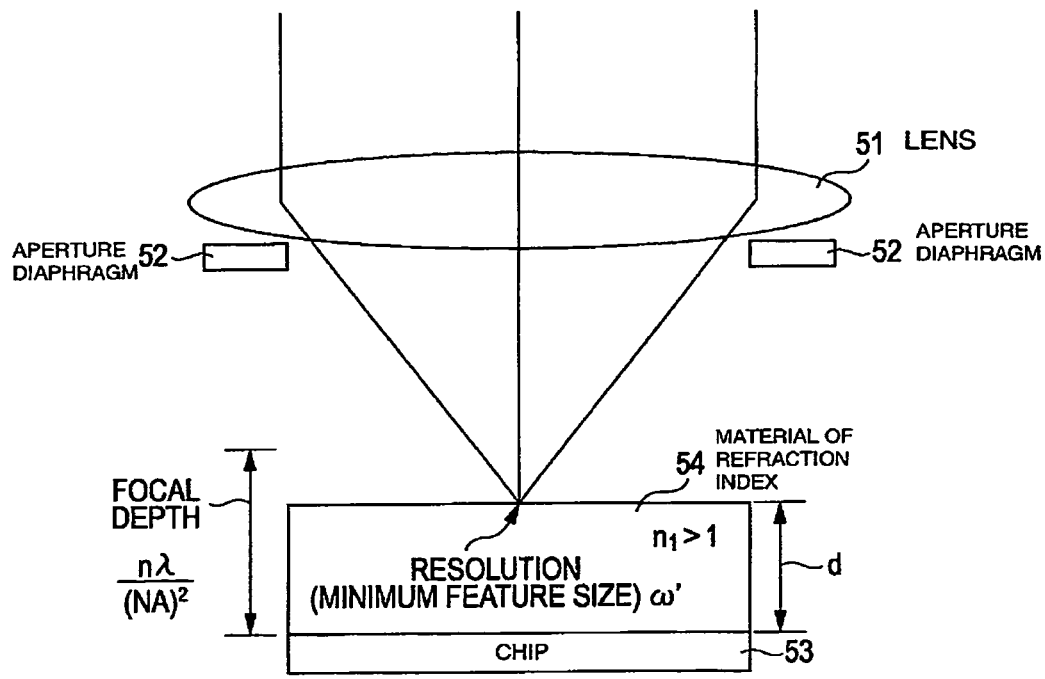
FIG. 30 is a diagram illustrating a configuration in the case where a thickness of a laminated material is made to be less than or equal to a focal depth of a lens.

Further, in the case where the depth d of the high-refraction-index material 54 laminated on the chip 53 is made to be less than or equal to a focal depth of the imaging lens 51, as shown in FIG. 30, the whole of resolution ω (a minimum feature size ω that can be resolved) is determined by resolution ω' (a minimum feature size ω' that can be resolved) resulting from focusing of an image on the foremost surface of the material 54. Therefore, it is considered that this phenomenon leads to a reduction of a degree of the improvement effects on the resolution (the minimum feature size that can be resolved).

Accordingly, it is considered that the lamination of a high-refraction-index material of a depth larger than or equal to a focal depth of the imaging lens 51 leads to a sufficient improvement effect on the further reduction of the resolution ω (the minimum feature size ω that can be resolved).

That is, provided that the following formula is satisfied, a sufficient improvement effect can be achieved.

$$d > \frac{n\lambda}{(NA)^2} \quad \text{(Number 2)}$$

Further, a larger value of the refraction index $n_1$ of the high-refraction-index material leads to an increase of the improvement effect on the further reduction of the resolution (the minimum feature size that can be resolved).

For example, in the case where the refraction index $n_1$ of the high-refraction-index material is larger than or equal to 1.6, that is, in the case where a condition $n_1 \geq 1.6$ is satisfied, it is possible to obtain a relatively sufficient improvement effect on the further reduction of the resolution (the minimum feature size that can be resolved).

In addition, in the case where a high-refraction-index material is provided in a part of a space between the imaging lens and the chip, in order to prevent reflection of light rays occurring on the surface of the high-refraction-index material, it is preferable to form a reflection prevention film on the surface of the high-refraction-index material. It is preferable that the refraction index $n_2$ of the reflection prevention film satisfies a condition: $1 < n_2 < n_1$, that is, the refraction index $n_2$ of the reflection prevention film is an intermediate value between "1" and the refraction index of the high-refraction-index material $n_1$, and further, relative to a wavelength $\lambda$ of incoming light rays, the depth $d_2$ of the reflection prevention film satisfies a condition: $d_2 \geq \lambda/4n_2$.

In order to reduce the chromatic aberration, it is preferable to use a material of a large Abbe number, which is more than or equal to "50", as the high-refraction-index material.

Further, in order to further reduce the chromatic aberration, as the high-refraction-index material, it is preferable to use a plurality of materials having Abbe numbers and wavelengths of dispersion which are different from one another. Further, for example, a material of a large Abbe number and a small wavelength of dispersion is convexly formed, and thereon, a material of a small Abbe number and a large wavelength of dispersion is concavely laminated.

Furthermore, in the case where a misalignment of imaging positions of respective images of the primitive colors (R, G and B) due to the chromatic aberration occurs, in order to align the imaging positions by the method of signal processing, a signal processing program may be implemented so that corrections to reduce or enlarge respective images of the primitive colors can be made. For example, in the case where, in the direction to an object, the imaging position of an image of the blue color B is shifted to the direction outer from the imaging position of an image of the green color G, and the imaging position of an image of the red color R is shifted to the direction inner therefrom, the blue color having a wavelength larger than the wavelength of the green color, the red color having a wavelength smaller than the wavelength of the green color, the imaging position of the image of the blue color B and the imaging position of the image of the red color R can be corrected by reducing the image of the blue color B and enlarging the image of the red color R.

No matter how the high-refraction-index material is formed between the chip and the imaging lens, for example, a method, in which a module resulting from molding of a high-refraction-index material or a module resulting from integrated molding of the imaging lens and the high-refraction-index material is provided in advance, and this module is bonded to the chip, can be considered.

Consequently, a solid-state image-taking apparatus according to this embodiment of the present invention is configured as described below.

(1) A solid-state image-taking apparatus according to this embodiment is configured to include a chip of a solid-state image-taking device, an imaging lens configured to focus light rays into an image on the surface of the solid-state image-taking device, and a material of a refraction index larger than "1" (i.e., a high-refraction-index material) arranged between the imaging lens and the chip.

(2) In the above-described configuration (1), a layer of the material of a refraction index larger than "1" (i.e., the high-refraction-index material) is configured to be laminated on the highest layer of the chip.

(3) In the above-described configuration (1), a layer of the material of a refraction index larger than "1" (i.e., the high-refraction-index material) is configured to occupy the whole of a space between the imaging lens and the chip. In this configuration, it is possible to realize an integrated formation of the imaging lens and the high-refraction-index material.

(4) In the above-described configuration (1), the material of a refraction index larger than "1" (i.e., the high-refraction-index material) is configured to include an optical part having a planer portion and a convex curved-surface-shaped portion, and cause the convex curved-surface-shaped portion to be contacted with the highest layer of the chip.

(5) In the above-described configuration (4), the width of the contact portion between the convex curved-surface-shaped portion and the highest layer of the chip is configured to be within a range of 800 nm. Since the width of the contact portion is within a range of 1.5 times the wavelength of 540 nm at the around center of visual light lays, light rays incoming from the curved-surface-shaped portion to the chip is suppressed from being spread inside a semiconductor layer of the chip.

(6) In the above-described configuration (4), the solid-state image-taking apparatus according to this embodiment is configured to further include waveguide paths which are formed between the convex curved-surface-shaped portion and light receivers of individual pixels included in the solid-state image-taking device. By providing the waveguide paths, it is possible to efficiently conduct light rays to the light receivers, and further, reduce the area of each of spots of light rays incoming to the light receivers.

(7) In the above-described configurations (1) to (6), the material of a refraction index larger than "1" (i.e., the high-refraction-index material) is configured to have an Abbe number larger than or equal to "50". Such a configuration enables chromatic aberration to be reduced.

(8) In the above-described configurations (1) to (6), the solid-state image-taking apparatus according to this embodiment is configured to, as the material of a refraction index larger than "1" (i.e., the high-refraction-index material), include a plurality of materials having wavelength dispersions different from one another. By causing the wavelength dispersions of the plurality of materials to be cancelled one another, it is possible to reduce the chromatic aberration.

(9) In the above-described configurations (1) to (8), the solid-state image-taking apparatus according to this embodiment is configured to include a reflection prevention film on the surface of the imaging lens side of the material of a refraction index larger than "1" (i.e., the high-refraction-index material), and make a refraction index of the reflection prevention film to be an intermediate value between "1" and a refraction index of the material of a refraction index larger than "1" (i.e., the high-refraction-index material).

(10) When manufacturing the solid-state image-taking apparatus including a chip of a solid-state imaging device and an imaging lens configured to focus incoming light rays into an image on the surface of the solid-state image-taking device, a material of a refraction index larger than "1" (i.e., a high-refraction-index material) is formed between the chip and the imaging lens.

(11) In the above-described manufacturing method (10), an optical part is produced by molding the material of a refraction index larger than "1" (i.e., the high-refraction-index material), and the optical part is bonded with the highest layer of the chip.

(12) A camera is configured to include a solid-state image-taking apparatus having therein a chip of a solid-state image-taking device, an imaging lens configured to focus light rays into an image on the surface of the solid-state image-taking device, and a material of a refraction index larger than "1" (i.e., a high-refraction-index material) arranged between the imaging lens and the chip.

Figure 1:
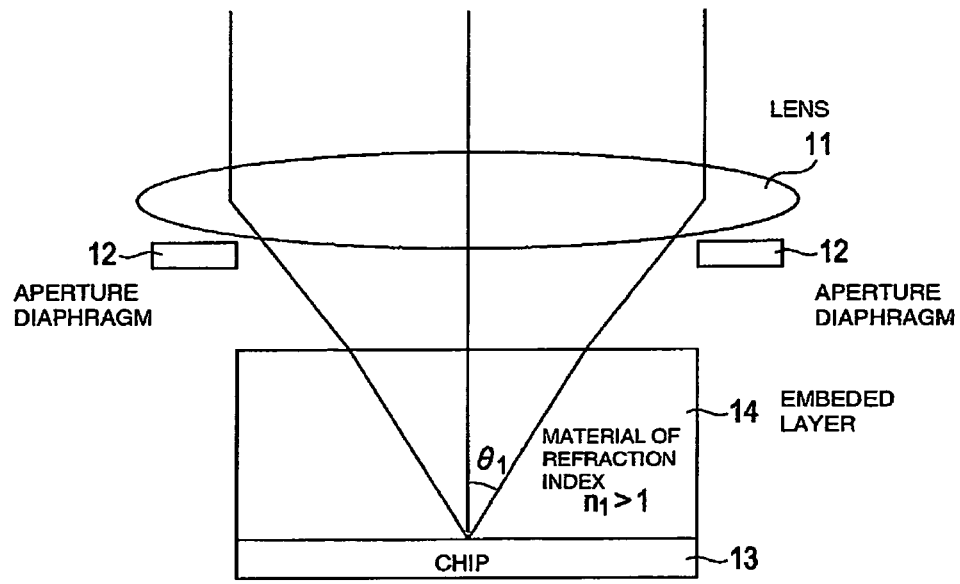
FIG. 1 is a schematic diagram illustrating a configuration of a first embodiment of a solid-state image-taking apparatus according to the present invention.

2. First Embodiment of Solid-State Image-Taking Apparatus According to Present Invention A schematic diagram illustrating a configuration of a first embodiment of a solid-state image-taking apparatus according to the present invention is shown in FIG. 1.

A solid-state image-taking apparatus according to this embodiment is configured to, in the same manner as or in a manner similar to that which was described with reference to FIGS. 24C and 25C, provide an embedded layer 14 including a material of a refraction index $n_1$ which is larger than that of the air (whose refraction index is "1"), i.e., $n_1 > 1$, in a part of a space between an imaging lens 11 and a chip 13 of a solid-state image-taking device.

The embedded layer 14 is laminated on the chip 13 of the solid-state image-taking device. A solid-state image-taking apparatus according to this embodiment is configured such that nothing is included in a space extending from the surface of the embedded layer 14 to the imaging lens 11 and an aperture diaphragm 12 in the same manner as or a manner similar to that of an existing solid-state image-taking apparatus.

As a material used for the embedded layer 14, a material of a high transmissivity with respect to light, the wavelength of which is within a wavelength band of light which can be optically received and detected, is used, and further, preferably, a transparent material is used.

As such a material of the embedded layer 14 as described above, for example, an oxide, such as an oxide silicon ($SiO_2$), or a silicon nitride ($SiN$) can be used. In the case of the oxide, it is preferable to make the oxide to be in the condition of glass.

As described above, no matter how the embedded layer is laminated on the chip of the solid-state image-taking device, in embodiments according to the present invention, it is possible to obtain an advantage in that resolution is improved.

Therefore, a solid-state image-taking apparatus according to this embodiment may be configured to include the embedded layer 14 laminated on the uppermost layer of the chip 13 of the solid-state image-taking device, or the embedded layer 14 laminated on the surface of a package which seals the chip 13 of the solid-state image-taking device therein.

Figure 2:
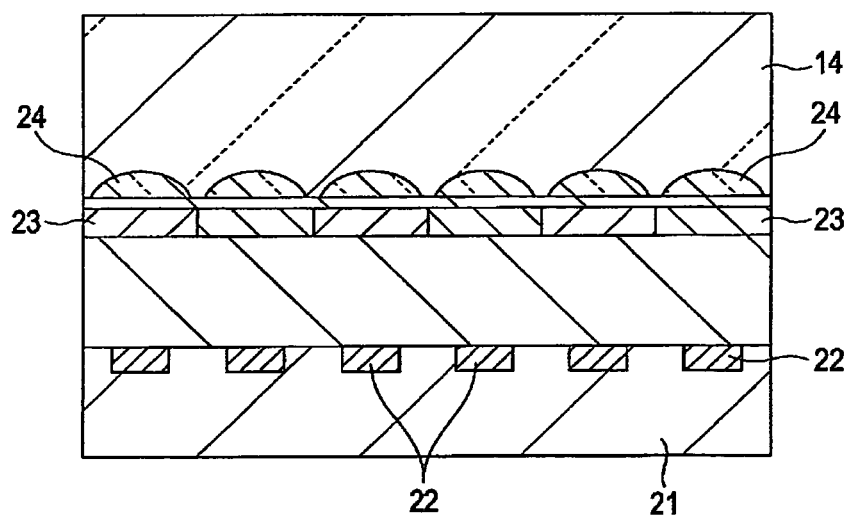
FIG. 2 is a cross-section diagram of a first embodiment of a solid-state image-taking apparatus according to the present invention, in the case where a solid-state image-taking device includes an on-chip color filter and an on-chip lens.

Here, in particular, a cross-section diagram in the case where the embedded layer 14 is laminated on the uppermost layer of the chip 13 of the solid-state image-taking device including an on-chip color filter and an on-chip lens is shown in FIG. 2.

As shown in FIG. 2, in each of pixels, a light receiver 22 including a photodiode formed on a semiconductor substrate 21 is formed, and above this light receiver 22, an on-chip color filter 23 and an on-chip lens 24 are formed.

Further, on the on-chip lenses 24, the embedded layer 14 is laminated, and concave and convex portions formed by the on-chip lenses 24 are covered by this embedded layer 14. This embedded layer 14 is not formed for each pixel, but is formed across the chip.

In addition, in FIG. 2, a configuration between the light receiver 22 and the on-chip color filter 23 is omitted from illustration.

In the configuration shown in FIG. 2, as described above, since the embedded layer 14 is directly laminated on the on-chip lens 24, it is preferable to make a refraction index of the embedded layer 14 to be smaller than a refraction index of the on-chip lens 24.

As a method of forming the embedded layer 14, for example, there is a method, in which a module resulting from molding of a material of the embedded layer 14, or a module resulting from integrated molding of the imaging lens 11 and the embedded layer 14 is provided, and this module is bonded with the upper surface of the chip 13.

Further, making the Abbe number of a high-refraction-index material included in the embedded layer 14 to be larger than or equal to "50" advantageously leads to a reduction of chromatic aberration.

In the above-described configuration according to this embodiment, the embedded layer 14 including a material of a refraction index larger than "1" is formed between the chip 13 of the solid-state image-taking device and the imaging lens 11, and thus, the embedded layer 14 enables further reduction of resolution (a minimum feature size that can be resolved). Furthermore, enabling reduction of the resolution (the minimum feature size that can be resolved) leads to making resolution to be higher than that of each of existing solid-state image-taking apparatuses, even in the case where the size of each of pixels included in a solid-state image-taking apparatus according to this embodiment is the same as the size of each of pixels included in the existing solid-state image-taking apparatus.

Accordingly, it is possible to obtain images of a sufficiently high resolution in accordance with minuteness of individual pixels beyond the limitation in increase of resolution due to a diffraction limit and aberration of the imaging lens 11.

Further, regardless of the F-value of the imaging lens 11, it is possible to realize a high resolution.

Figure 3:
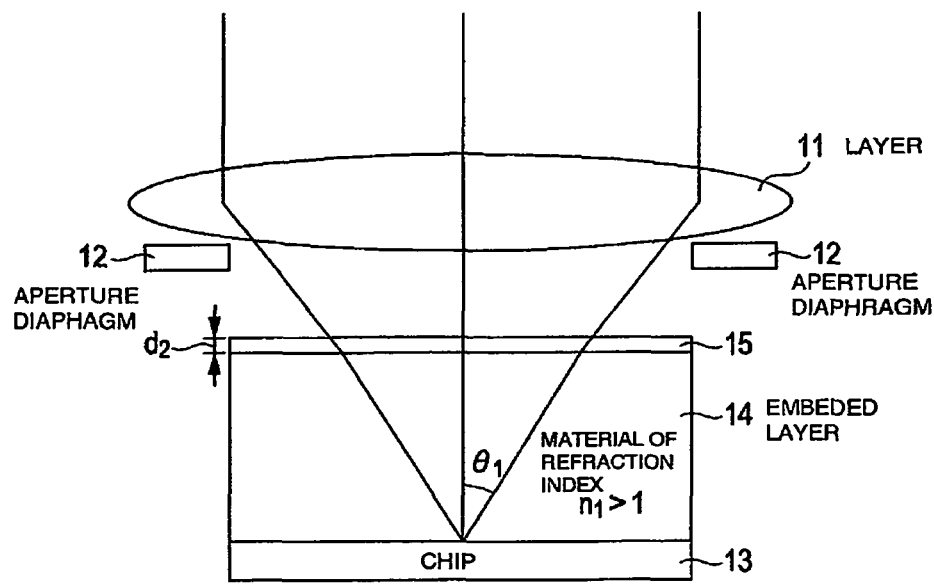
FIG. 3 is a diagram illustrating an example of a modified configuration, in which a part of the configuration of the first embodiment shown in FIG. 1 is modified.

Subsequently, an example of a modified configuration, in which a part of the configuration according to the first embodiment is modified, is shown in FIG. 3.

As shown in FIG. 3, a reflection prevention film 15 is formed on the embedded layer 14. A refraction index $n_2$ of this reflection prevention film 15 satisfies the following condition: $n_1 > n_2 > 1$.

The formation of the reflection prevention film 15 on the embedded layer 14 in such a manner as described above results in suppression of the reflection of incoming light rays occurring on the surface of the embedded layer 14, and thus, enables causing the incoming light rays to efficiently enter the light receivers included in the chip 13.

Further preferably, the reflection prevention film 15 is formed so that the thickness $d_2$ of the reflection prevention film 15 satisfies the following formula with respect to the wavelength $\lambda$ of the incoming visual light rays: $d_2 = \lambda/4n_2$.

Due to this formation, it is possible to suppress the reflection of incoming light lays occurring on the surface of the embedded layer 14 further effectively.

Figure 4A:
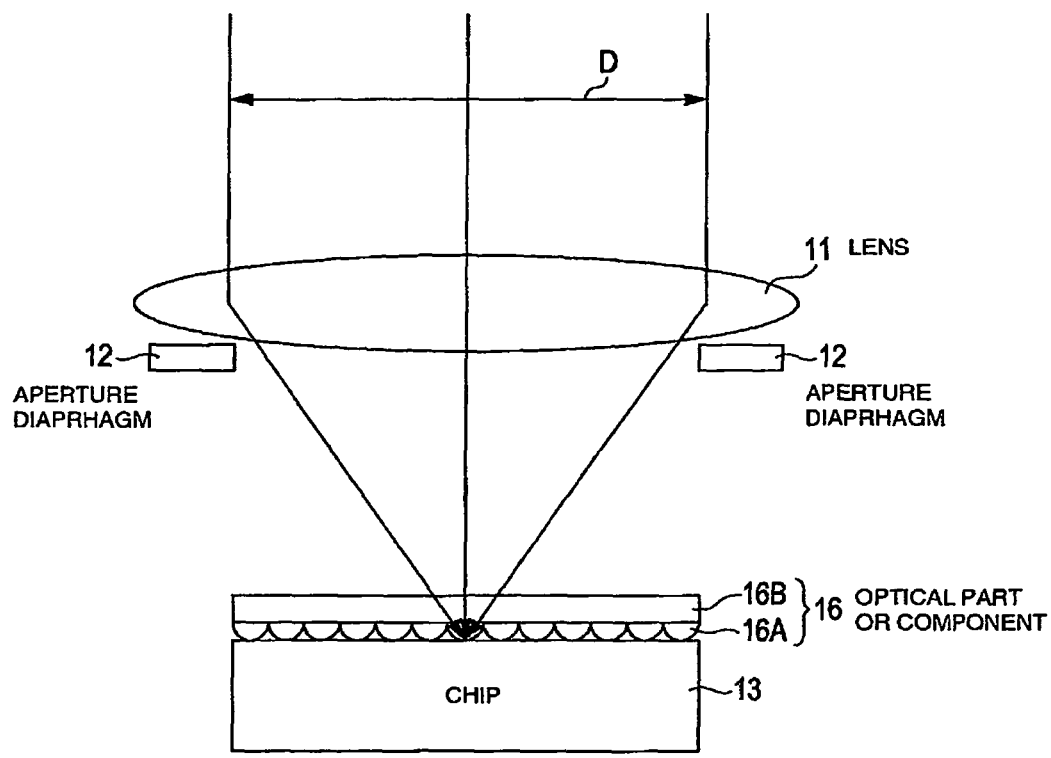
FIGS. 4A and 4B are schematic diagrams each illustrating a configuration of a second embodiment of a solid-state image-taking apparatus according to the present invention.
Figure 4B:
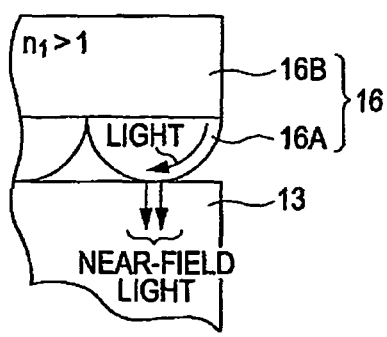

3. Second Embodiment of Solid-State Image-Taking Apparatus According to Present Invention A schematic diagram illustrating a configuration of a second embodiment of a solid-state image-taking apparatus according to the present invention is shown in FIGS. 4A and 4B. FIG. 4A is a diagram illustrating an overall configuration of a second embodiment just like FIG. 1, and FIG. 4B is a diagram resulting from enlargement of a key part of the overall configuration shown in FIG. 4A.

In a solid-state image-taking apparatus according to this second embodiment, in order to further improve the resolution thereof, near-field light is utilized by causing an optical part, which is formed of a high-refraction-index material having a convex curved-surface-shaped (spherical-surface-shaped or cylindrical-surface-shaped) portion at the bottom thereof, to be contacted with the surface of the chip of the solid-state image-taking device.

That is, as shown in FIGS. 4A and 4B, an optical part 16 is configured to have a high-refraction-index material which includes a convex curved-surface-shaped (spherical-surface-shaped or cylindrical-surface-shaped) portion 16A formed at the bottom side thereof where the chip 13 of the solid-state image-taking device is allocated, and a planar portion 16B formed at the top side thereof where the imaging lens 11 is allocated. Further, the curved-surface-shaped portion 16A of the optical part 16 is configured to be contacted with the surface of the chip 13.

Provision of such a configuration as described above makes a refraction index of a space surrounding the curved-surface-shaped portion 16A to be smaller than that of the curved-surface-shaped portion 16A. Therefore, as shown in FIG. 4B, incoming light, which has entered the curved-surface-shaped portion 16, proceeds along the inside of the curved surface, becomes near-field light at a point where the light is focused, and the near-field light enters the chip 13 from the surface thereof. Such a configuration enables prevention of influences due to the diffraction limit and the aberration.

In addition, it is preferable that the curved-surface-shaped portion 16A of the optical part 16 is configured so as to correspond to each of the light receivers, that is, each of the pixels.

In the above-described configuration according to this embodiment, the optical part 16 including a material of a refraction index larger than "1" is formed in a space between the chip 13 of the solid-state image-taking device and the imaging lens 11, and thus, the optical part 16 enables further reduction of resolution (a minimum feature size that can be resolved). Furthermore, enabling reduction of the resolution (the minimum feature size that can be resolved) leads to making resolution to be higher than that of each of existing solid-state image-taking apparatuses, even in the case where the size of each of pixels included in a solid-state image-taking apparatus according to this embodiment is the same as the size of each of pixels included in the existing solid-state image-taking apparatus.

Accordingly, it is possible to obtain images of a sufficiently high resolution in accordance with minuteness of individual pixels beyond the limitation in increase of resolution due to a diffraction limit and aberration of the imaging lens 11.

Further, regardless of the F-value of the imaging lens 11, it is possible to realize a high resolution.

Furthermore, in the above-described configuration according to this embodiment, the optical part 16, which includes a convex curved-surface-shaped (spherical-surface-shaped or cylindrical-surface-shaped) portion 16A formed at the bottom side thereof where the chip 13 is allocated, and a planar portion 16B, is configured to cause the curved-surface-shaped portion 16A to be contacted with the surface of the chip 13. Provision of such a configuration causes the curved-surface-shaped portion 16A to convert the incoming light rays into near-field light, which enters the chip 13 from the surface thereof, and thus, enables prevention of influences due to the diffraction limit and the optical aberration.

Figure 31A:
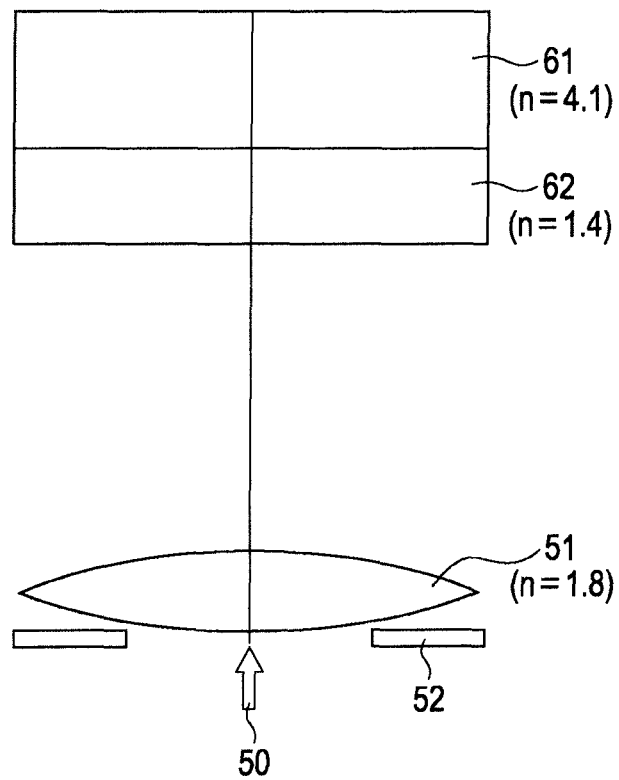
FIGS. 31A and 31B are diagrams illustrating configurations used in a wave motion simulation.
Figure 31B:
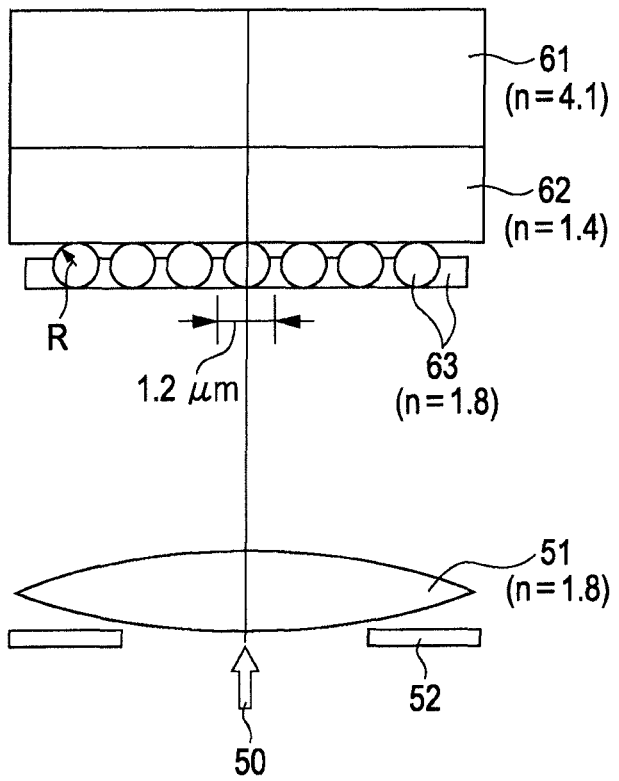

Here, effects obtained by causing a high-refraction-index material to have a convex curved-surface-shaped portion at the bottom thereof, just like in the second embodiment, the effects being resulting from a wave motion simulation using the FDTD method, will be described below. Configurations used in the simulation are shown in FIGS. 31A and 31B. A configuration in the case of an existing solid-state image-taking device is shown in FIG. 31A, and a configuration in the case of the second embodiment according to the present invention is shown in FIG. 31B. The top and bottom relation with respect to an imaging lens and a chip shown in each of FIG. 1, FIG. 4 and the like is reversed in FIGS. 31A and 31B. The aperture diaphragm 52 is allocated at the object side (at the side from which a light ray 50 enters) of the imaging lens 51, and it is assumed that the refraction index n of the imaging lens 51 is 1.8, that is, n=1.8.

It is assumed that the chip of the solid-state image-taking device is configured to include a silicon material 61 (whose refraction index n is 4.1) and a layer 62 having a refraction index n=1.4 and the thickness of 2 μm. In FIG. 31B, it is further assumed that the layer 62 is configured to be contacted with a curved-surface-shaped portion of a layer 63 formed of a high-refraction-index material.

With respect to the layer 63 formed of a high-refraction-index material, it is assumed that a refraction index n is 1.8 and the pitch of individual pixels is 1.2 μm, and further, with respect to a radius R of each of the curved-surface portions which are convex in the direction below the curved-surface-shaped portion of the layer 63, two cases are assumed, one being that the radius R is 0.5 μm, the other one being that the radius R is 0.6 μm.

Furthermore, it is assumed that the wavelength $\lambda$ of incoming light rays is 540 nm.

Figure 32A:
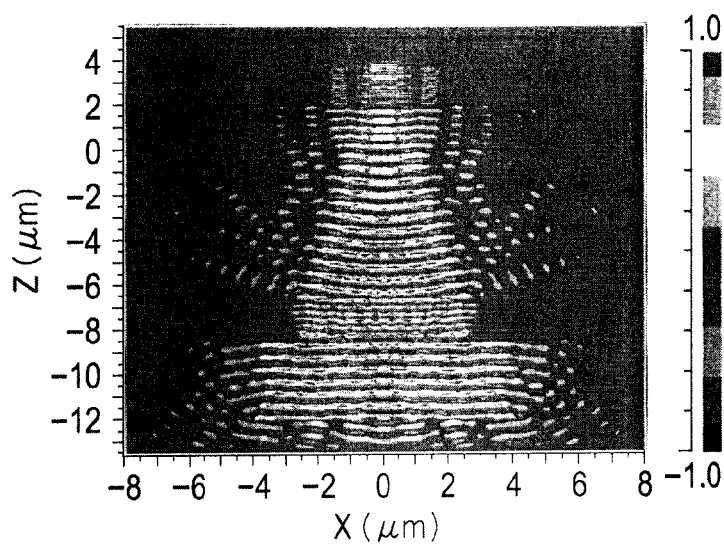
FIGS. 32A to 32C are diagrams illustrating results of a simulation with respect to configurations shown in FIGS. 31A and 31B.
Figure 32B:
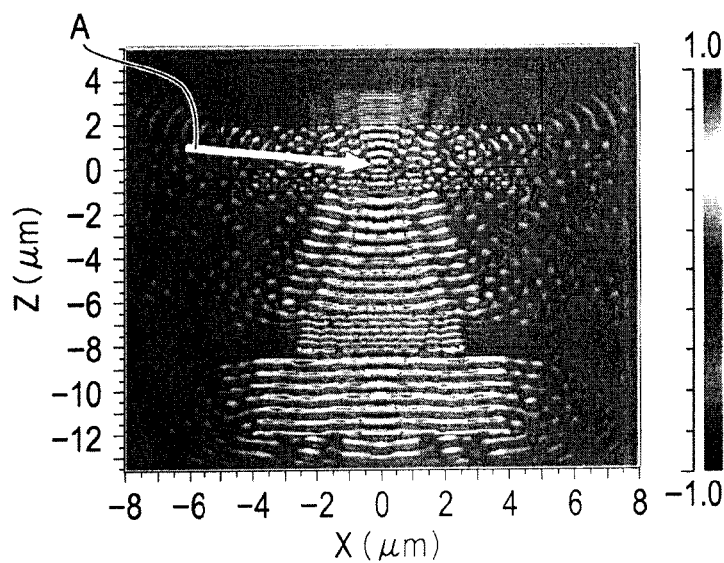
Figure 32C:
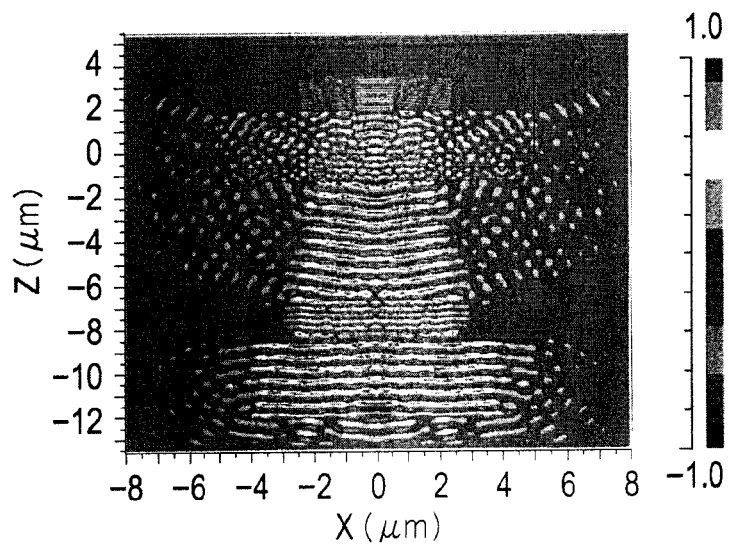

The results of the simulation are shown in FIGS. 32A to 32C. In FIG. 32A, the result of the simulation with respect to the configuration of an existing solid-state image-taking apparatus, shown in FIG. 31A, is shown. In FIG. 32B, the result of the simulation is shown with respect to the configuration shown in FIG. 31B in the case where the radius R of the curved surface is 0.5 μm, and in FIG. 32C, the result of the simulation is shown with respect to the configuration shown in FIG. 31B in the case where the radius R of the curved surface is 0.6 μm.

It can be understood from the results of the simulation shown in FIGS. 32A to 32C that the diameter of a light spot, which is obtained by causing the imaging lens to focus incoming light on the surface of the chip, is narrowed to a greater degree in the configuration of the second embodiment than the diameter of a light spot in the case of the configuration of the existing solid-state image-taking apparatus. For example, in FIG. 32B, as denoted by an arrow A, the diameter of a light spot of light rays entering the chip is narrowed.

Accordingly, by providing the configuration according to the second embodiment, it is possible to improve the resolution.

Figure 33:
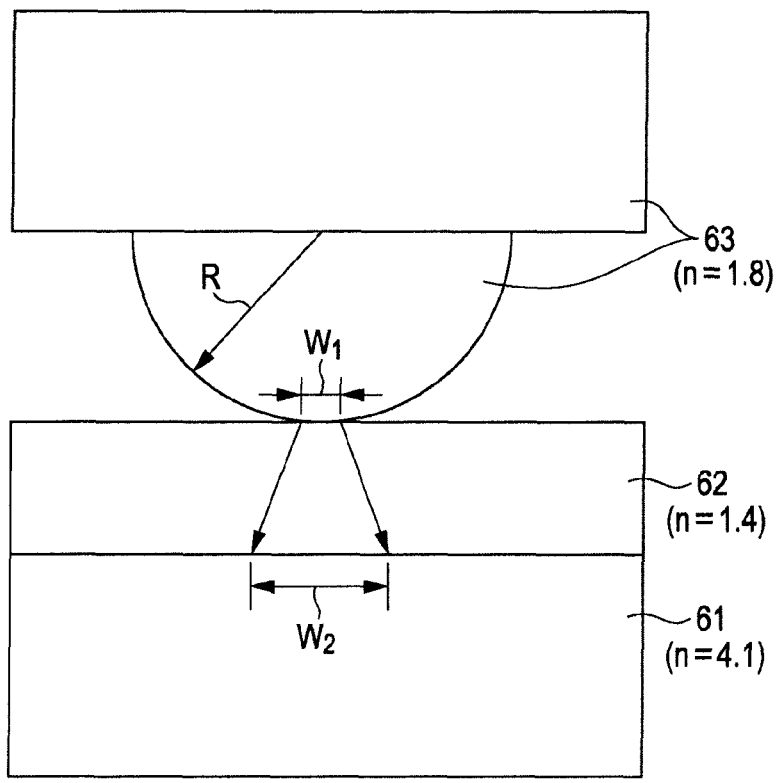
FIG. 33 is a diagram illustrating a configuration used in an optical simulation.

Further, as shown in a cross-section diagram of FIG. 33, the chance of the width $w_2$ of a portion on the surface of the silicon material 61, resulting from spreading of light rays, in accordance with variation of the width $w_1$ of a contact portion between a curved-surface-shaped (a spherical-surface-shaped or a cylindrical-surface-shaped) portion of the high-refraction-index material 63 and the surface of the layer 62, was investigated by means of an optical simulation method. In addition, it is assumed that the wavelength λ of incoming light rays is 540 nm.

Figure 34:
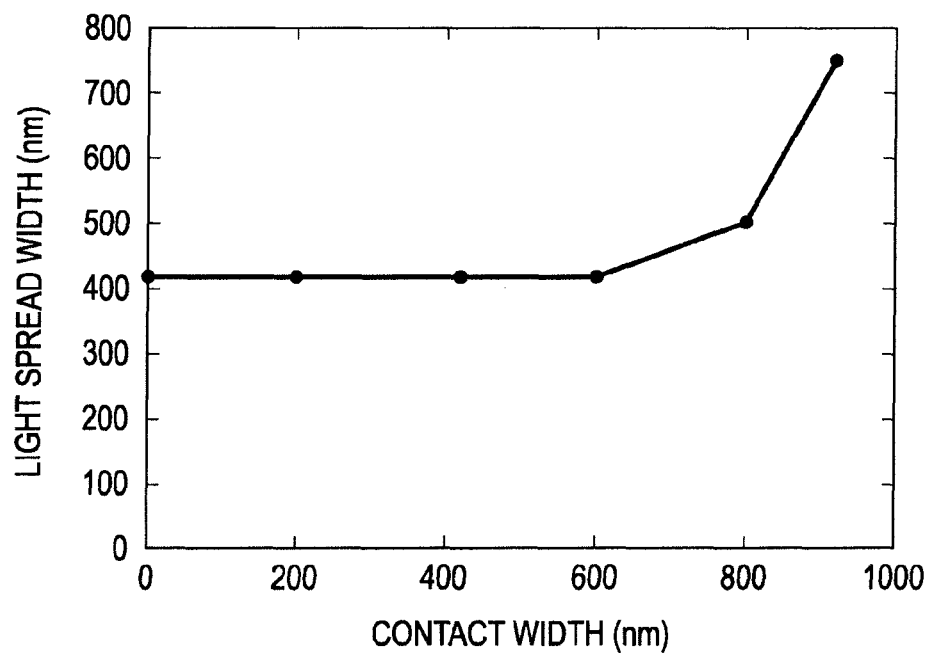
FIG. 34 is a diagram illustrating a relationship between a contact width and a light spreading width.

As a result of the simulation, a relation between the width $w_1$ (nm) of the contact portion and the width $w_2$ (nm) of the portion resulting from spreading of light rays is shown in FIG. 34.

As shown in FIG. 34, in the case of λ=540 nm, it can be confirmed that, provided that the width of the contact portion is within a range less than or equal to 800 nm, the width of the portion resulting from spreading of light rays entering the silicon material 61 can be suppressed.

Since the portion resulting from spreading of light rays is proportional to the wavelength λ of light rays, the allowable value of the contact width is within 1.5 times the wavelength of light rays.

Figure 5A:
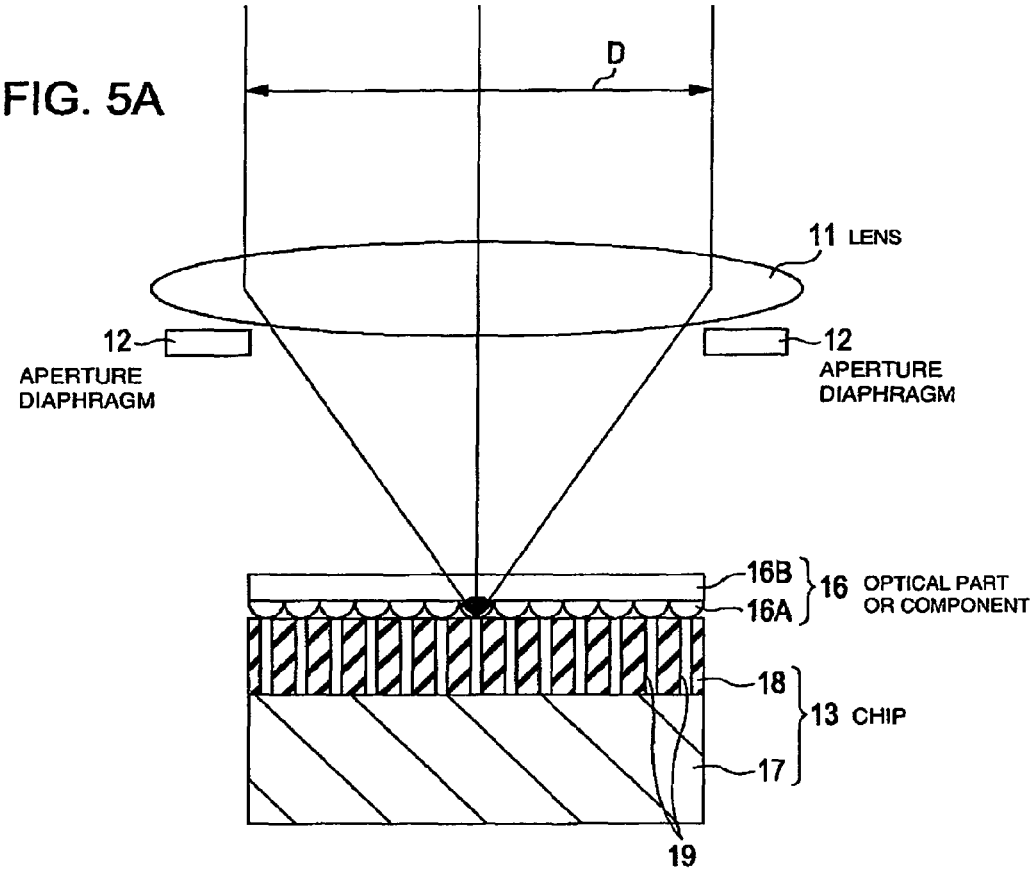
FIGS. 5A and 5B are schematic diagrams each illustrating a configuration of a third embodiment of a solid-state image-taking apparatus according to the present invention.
Figure 5B:
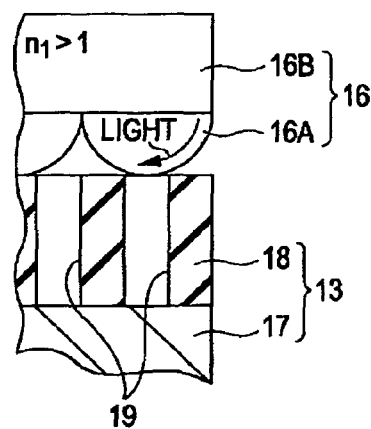

4. Third Embodiment of Solid-State Image-Taking Apparatus According to Present Invention A schematic diagram of a third embodiment of a solid-state image-taking apparatus according to the present invention is shown in FIG. 5. FIG. 5A is a diagram illustrating an overall configuration of a third embodiment just like FIG. 1 and FIG. 4A, and FIG. 5B is a diagram resulting from enlargement of a key part of the overall configuration shown in FIG. 5A.

This third embodiment is configured to, in addition to the configuration of the second embodiment, shown in FIGS. 4A and 4B, in which near-field light is utilized, include waveguide paths for the purpose of suppressing spreading of light rays, and thereby, improve an amount of light rays entering light receivers.

That is, as shown in FIGS. 5A and 5B, in a layer 18 (an insulating layer and the like) provided on a silicon material 17, columnar waveguide paths 19 are formed so as to connect between the upper surface of the layer 18 and the silicon material 17. Using a material of a fraction index larger than that of the layer 18, which surrounds the waveguide paths 19, as a material included in each of the waveguide paths 19, causes light rays to be reflected on the surfaces of walls of the waveguide paths 19 and be conducted in the direction to the light receivers. The waveguide paths 19 are configured to each correspond to a light receiver, that is, a pixel.

The shape of each of waveguide paths 19 is, for example, a circular column, an elliptic column, a square column or the like.

Further, on the layer 18, an optical part 16 (16A and 16B) is formed. The curved-surface-shaped portions 16A of the optical part 16 are configured to each correspond to a waveguide path 19, and further, are configured to each correspond to a light receiver, that is, a pixel.

The provision of the waveguide paths 19 on the silicon material 17 causes light rays entering the layer 18 to proceed to the light receives along the surfaces of the walls of the waveguide paths 19, and thus, suppresses the widths of spreading of light lays entering the silicon material 17 (i.e., the diameter of each of light spots) to a width smaller than or equal to the width of each of the waveguide paths 19. Therefore, the reduction of the diameter of each of the light spots produced on the surface of the silicon material 17 enables light rays of a sufficient amount of light to enter a light receiver corresponding to each pixel.

A solid-state image-taking apparatus according to this embodiment can be manufactured, for example, by using manufacturing processes as described below.

Figure 6A:
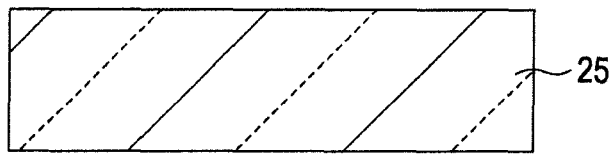
FIGS. 6A to 6D are manufacturing process diagrams each illustrating a manufacturing method of a solid-state image-taking apparatus shown in FIG. 5, according to an embodiment of the present invention.

Firstly, as shown in FIG. 6A, a substrate material 25, which is incorporated as a part of the optical part 16, is provided.

Figure 6B:
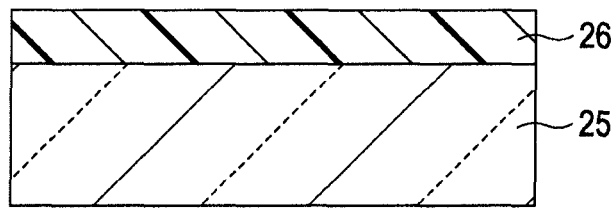

Next, as shown in FIG. 6B, a resist 26 is coated on the surface of the substrate material 25.

Figure 6C:
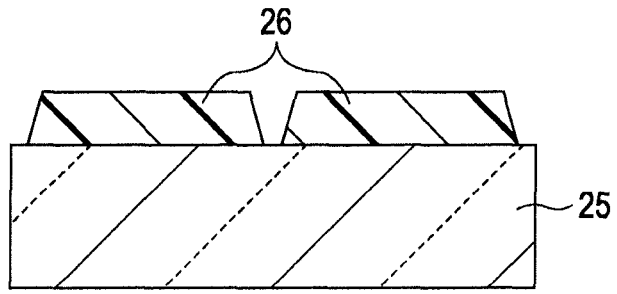

Next, as shown in FIG. 6C, the resist 26 of a trapezoidal-shaped cross-section is obtained by exposing and developing the resist 26.

Figure 6D:
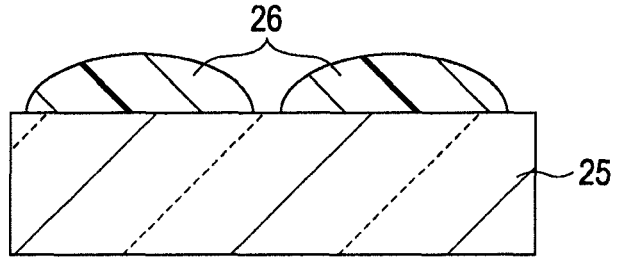

Next, as shown in FIG. 6D, the cross-section of the resist 26 is changed from the trapezoidal shape into a curved-surface by performing a postbaking process and a reflow soldering process of the resist 26.

Figure 7E:
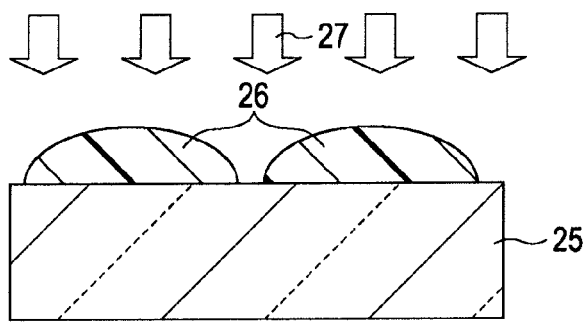
FIGS. 7E to 7H are manufacturing process diagrams each illustrating a manufacturing method of a solid-state image-taking apparatus shown in FIG. 5, according to an embodiment of the present invention.
Figure 7F:
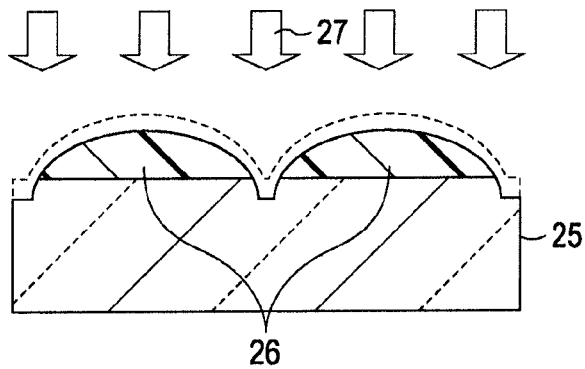
Figure 7G:
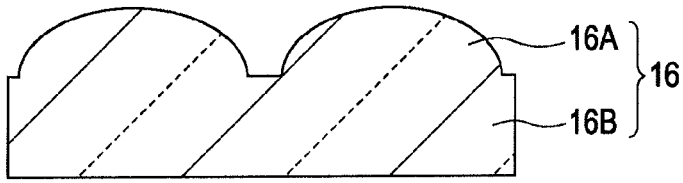

Next, as shown in FIG. 7E, an edging process 27 is performed from above the resist 26 by using a reactive ion edging (RIE) method. By performing this process, as shown in FIG. 7F, the shape of the resist 26 is gradually transcribed onto the substrate material 25. Further, finally, as shown in FIG. 7G, the shape of the resist 26 is completely transcribed on the substrate material 25, and the optical part 16 having curved-surface-shaped portions 16A is produced.

Figure 7H:
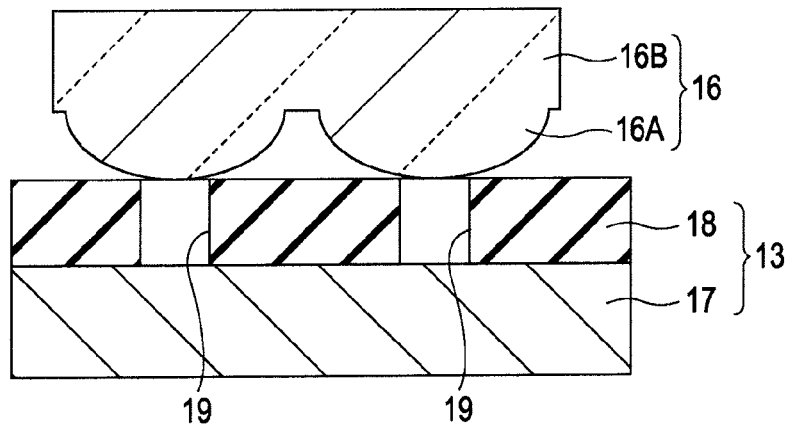

Subsequently, as shown in FIG. 7H, the optical part 16 resulting from reversing of the top and down thereof is attached to the surface of the chip 13, which includes therein the silicon material 17 and the layer 18 being formed on the silicon material 17 and having waveguide paths 19 therein, so that the positions of waveguide paths 19 and those of the corresponding curved-surface-shaped portions 16A are mutually aligned, respectively.

By performing the processes described above, it is possible to manufacture a solid-state image-taking apparatus according to this embodiment.

Further, a solid-state image-taking apparatus according to this embodiment can be also manufactured by using another manufacturing process as described below.

Figure 8A:
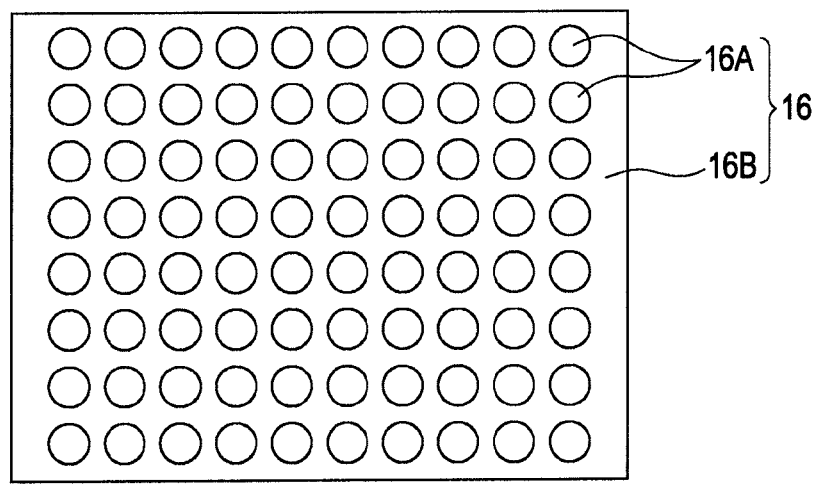
FIGS. 8A and 8B are manufacturing process diagrams each illustrating a manufacturing method of a solid-state image-taking apparatus shown in FIG. 5, according to an embodiment of the present invention.
Figure 8B:
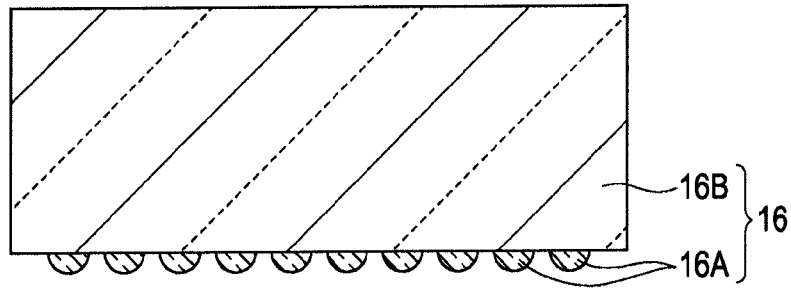

For example, the optical part 16, which is made of a glass substrate, and includes a thick and planer substrate 16B and spherical-surface-shaped portions 16A being convex in the direction below and being formed so as to correspond to respective pixels, is produced in advance by using an injection molding method, the plain view of the optical part 16 being shown in FIG. 8A, the cross-section view thereof being shown in FIG. 8B.

Figure 9:
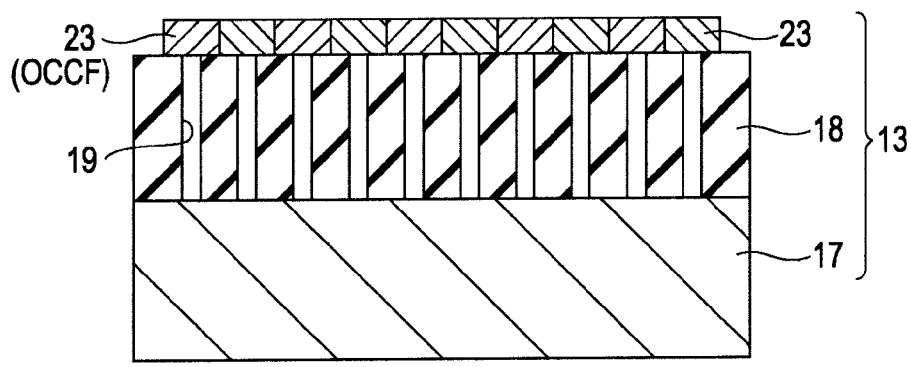
FIG. 9 is a manufacturing process diagram illustrating a manufacturing method of a solid-state image-taking apparatus shown in FIG. 5, according to an embodiment of the present invention.
Figure 10:
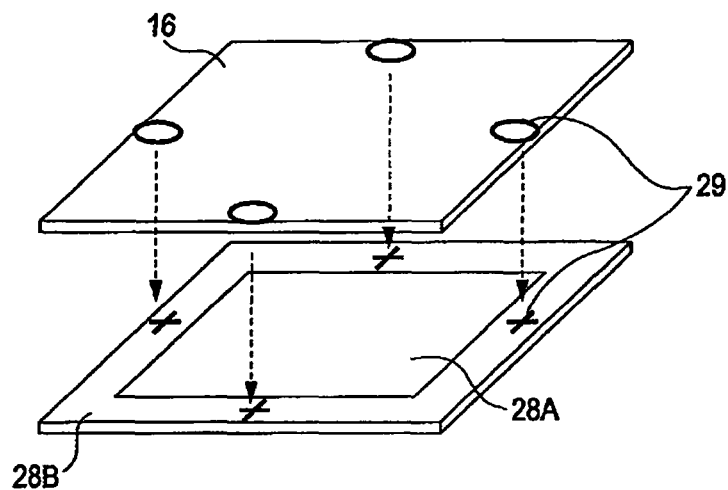
FIG. 10 is a diagram illustrating a method for bonding a chip with a glass substrate by using markers, according to an embodiment of the present invention.

Next, the optical part 16 is bonded with the chip 13 of the solid-state image-taking device including the waveguide paths 19 therein, which is shown in FIG. 9. In this case, for example, it is possible to make the pitch of pixels to be 1.2 μm, the radius R of each of the spherical-surface-shaped portions 16A to be 0.5 µm, the thickness of the glass substrate to be 5 cm, and the pitch of the waveguide paths 19 to be 0.6 µm. In addition, in the chip 13 shown in FIG. 9, on-chip color filters (OCCFs) 23 are further formed on the corresponding waveguide paths 19, respectively. When attaching the optical part 16 to the chip 13, for example, as shown in FIG. 10, it is preferable to perform a position adjustment using an alignment tool with respect to the spherical-surface-shaped portions 16A so that the positions of the spherical-surface-shaped portions 16A and those of the positions of the corresponding pixels of the chip 13 are mutually aligned by using markers 29 provided on an edge portion 28B surrounding a light receiving surface 28A of the solid-state image-taking device. For the attachment of the optical part 16 to the chip 13, it is preferable to use an ultraviolet curing material of a refraction index smaller than that of the glass substrate.

In addition, it is not necessary to form the waveguide paths 19 so that they are completely passed through the layer 18, but it is possible to form each of the waveguide paths 19 within a partial section extending in the depth direction of the layer 18.

According to the configuration of this embodiment, in addition to the configuration of the second embodiment, the waveguide paths 19 are further formed in the layer 18 located between the silicon material 17, in which light receivers are formed, and the optical part 16. Providing such a configuration enables suppression of the widths of spreading of light lays entering the silicon material 17 (i.e., the diameter of each of light spots) to a width smaller than or equal to the width of each of the waveguide paths 19, thus, enables reduction of the diameter of each light spot produced on the surface of the silicon material 17, and enables causing a sufficient amount of light to enter the light receivers corresponding to respective pixels.

Meanwhile, in the results of the simulation, shown in FIGS. 32B and 32C, the spot is certainly narrowed on the surface of the sensor, but is spread on the surface of the silicon material 61, on which photodiodes are formed.

As shown in this third embodiment, forming waveguide paths so as to correspond to respective pixels enables reduction of each of spots produced on the silicon material. This fact was confirmed by performing a simulation.

Figure 35A:
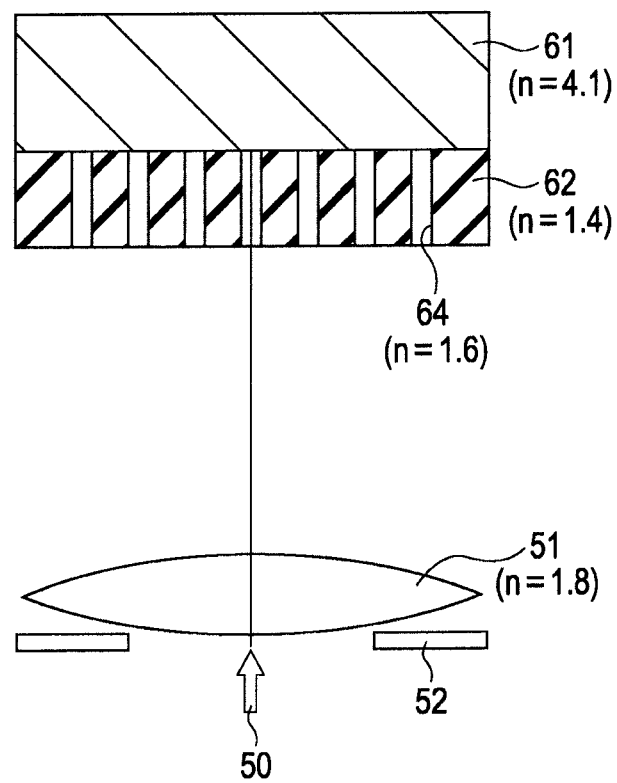
FIGS. 35A and 35B are diagrams illustrating configurations used in a wave movement simulation.
Figure 35B:
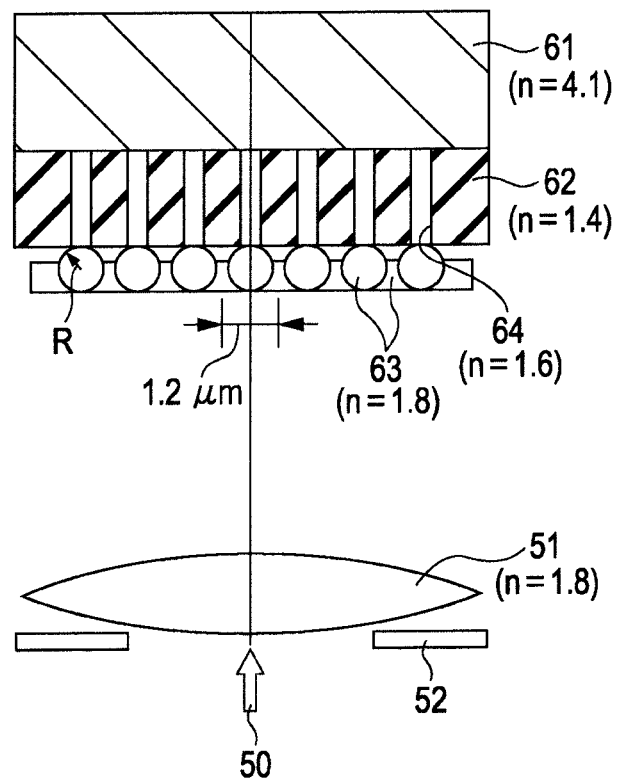

With respect to configurations shown in FIGS. 35A and 35B, in which waveguides each having a fraction index n=1.6 are formed on the surface of the sensors, the simulation was performed in the same manner as or in a manner similar to that in the case of configurations shown in FIGS. 31A and 31B. In addition, as shown in FIG. 35A, for the purpose of comparison, the waveguide paths 64 are also provided in the existing configuration. It is assumed that the diameter of each of the waveguide paths 64 is 0.6 µm, and the refraction index n inside each of the waveguide paths is 1.6, i.e., n=1.6, and other conditions are the same as those in the case of the configurations shown FIGS. 31A and 31B.

Figure 36A:
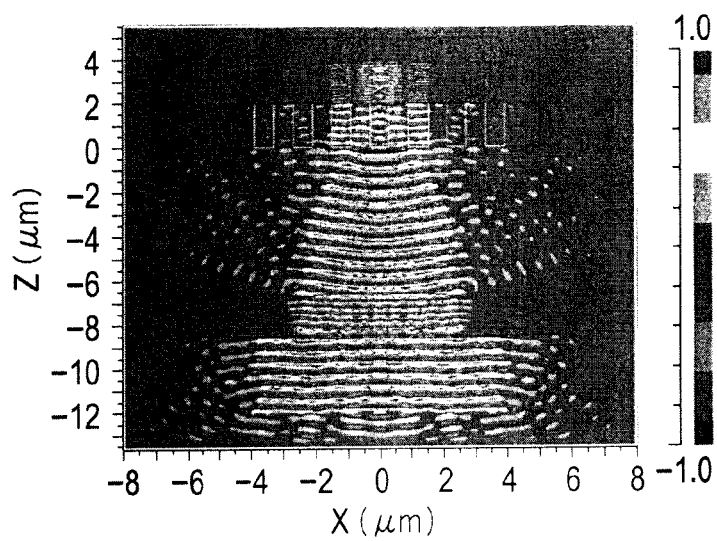
FIGS. 36A to 36C are diagrams illustrating results of a simulation with respect to configurations shown in FIGS. 35A and 35B.
Figure 36B:
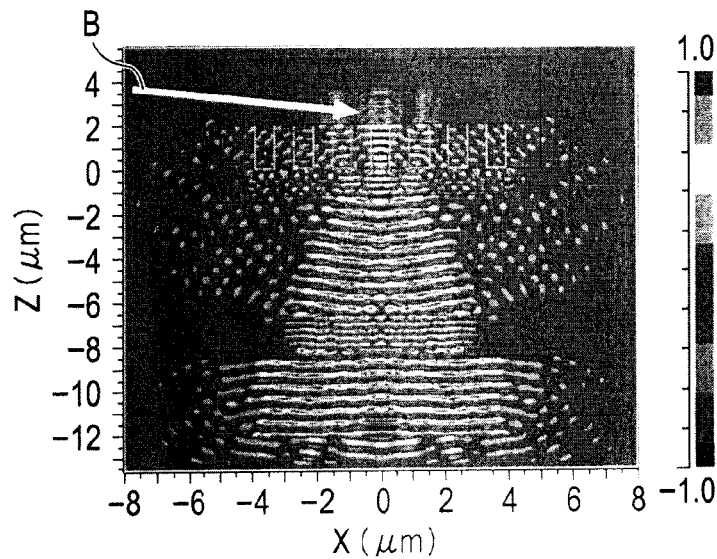
Figure 36C:
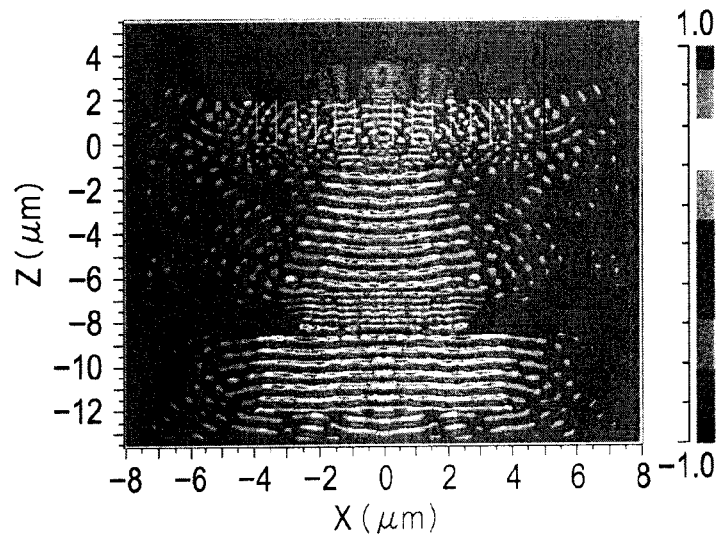

The results of the simulation are shown in FIGS. 36A to 36C. In FIG. 36A, the result of the simulation in the case of the existing configuration of FIG. 35A is shown. In FIG. 36B, the result of the simulation in the case where the radius R of each of the curved surfaces is 0.5 µm in the configuration of FIG. 35B is shown, and in FIG. 36C, the result of the simulation in the case where the radius R of each of the curved surfaces is 0.6 µm in the configuration of FIG. 35B is shown.

It can be understood from the results of the simulation, shown in FIGS. 36B and 36C, that, by providing the waveguide paths 64, a light spot is narrowed on the silicon material, and even inside the silicon material. For example, in FIG. 36B, as denoted by an arrow B, a spot of each of light rays entering inside the silicon material is narrowed. This result of the simulation means that further improvement of the resolution is achieved.

Figure 11:
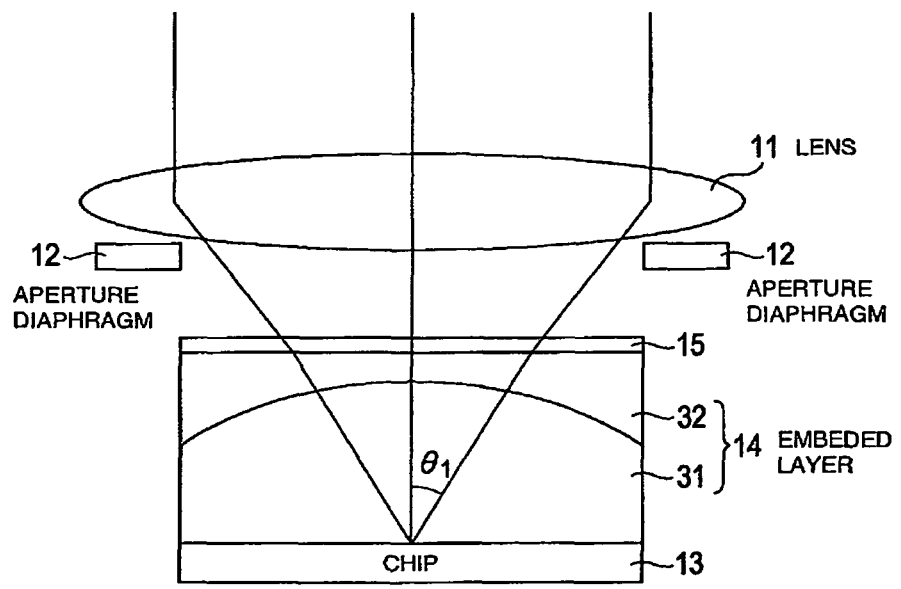
FIG. 11 is a schematic diagram illustrating a configuration of a fourth embodiment of a solid-state image-taking apparatus according to the present invention.

5. Fourth Embodiment of Solid-State Image-Taking Apparatus According to Present Invention A schematic diagram illustrating a configuration of a fourth diagram of a solid-state image-taking apparatus according to the present invention is shown in FIG. 11.

A solid-state image-taking apparatus according to this embodiment is configured to, in order to reduce chromatic aberration, include an embedded layer formed of a plurality of layers resulting from lamination of a layer including a material having a large wavelength dispersion and a layer including a material having a small wavelength dispersion. That is, as shown in FIG. 11, a solid-state image-taking apparatus according to this embodiment is configured to include an embedded layer 14 resulting from lamination of a layer 31 and a layer 32, the layer 31 being a convex surface layer including a material having a large Abbe number (larger than or equal to 50), the layer 32 being a concave surface layer including a material having a small Abbe number (less than or equal to 50).

On this embedded layer 14, a reflection prevention film 15, which is the same as or similar to that shown in FIG. 3, is formed.

The convex surface layer 31, which is a lower layer of the embedded layer 14, is of a large Abbe number, and thus, a wavelength dispersion thereof is small. Further, the concave surface layer 32, which is a higher layer of the embedded layer 14, is of a small Abbe number, and thus, a wavelength dispersion thereof is large. By laminating these two layers 31 and 32, which have wavelength dispersions different from each other, chromatic aberration occurring in each of the layers is cancelled each other, and thus, it is possible to reduce chromatic aberration of the whole of the embedded layer 14 including the layers 31 and 32.

As described above, even in the case where the embedded layer 14 is formed of one layer, provided that an Abbe number of the embedded layer 14 is larger than or equal to 50, the chromatic aberration thereof is reduced.

However, in the case where the chromatic aberration occurs although the Abbe number of the embedded layer 14 is made to be larger than or equal to 50, the chromatic aberration can be further reduced by adopting the configuration according to this embodiment, in which an embedded layer including a plurality of layers having wavelength dispersions different from one another is formed.

A solid-state image-taking apparatus according to this embodiment can be manufactured, for example, in accordance with manufacturing processes shown in FIG. 12.

Figure 12A:
FIGS. 12A to 12E are manufacturing process diagrams each illustrating a manufacturing method of a solid-state image-taking apparatus shown in FIG. 5, according to an embodiment of the present invention.

Firstly, as shown in FIG. 12A, the chip 13 of the solid-state image-taking device is provided.

Figure 12B:
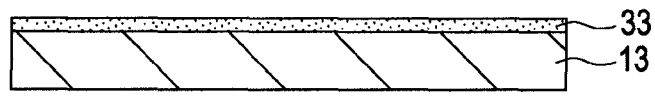

Next, as shown in FIG. 12B, an optical bonding adhesive 33, which is an ultraviolet curing adhesive, is coated on the surface of the chip 13.

Figure 12C:
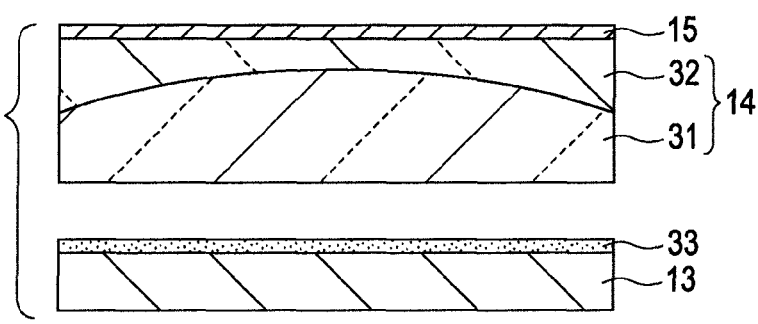

Meanwhile, as shown in FIG. 12C, the glass substrate (the embedded layer) 14 is formed by attaching the convex surface layer 31, including a material of an Abbe number larger than or equal to 50, to the concave surface layer 32, including a material of an Abbe number smaller than or equal to 50. Further, on the surface of the glass substrate (the embedded layer) 14, the reflection prevention film 15 is formed by means of vacuum evaporation. It is possible to form the reflection prevention film 15 so that it has, for example, a refraction index of 1.6, and a thickness of 80 nm.

Figure 12D:
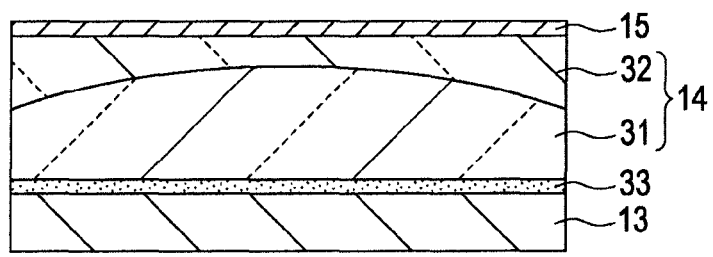

Next, as shown in FIG. 12D, an optical part is mounted on the optical bonding adhesive 33.

Figure 12E:
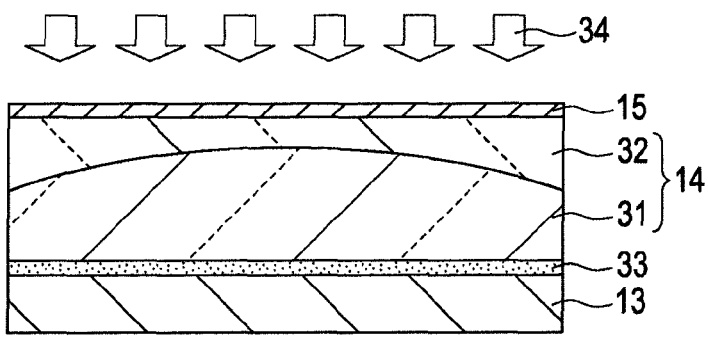

Subsequently, as shown in FIG. 12E, the optical part is bonded with the chip 13 by causing ultraviolet rays 34 to harden the optical bonding adhesive 33.

By performing such the processes as described above, it is possible to manufacture a solid-state image-taking apparatus according to this embodiment.

In the above-described configuration according to this embodiment, the embedded layer 14 including a material of a refraction index larger than "1" is formed between the chip 13 of the solid-state image-taking device and the imaging lens 11, and thus, the embedded layer 14 enables further reduction of resolution (a minimum feature size that can be resolved). Furthermore, enabling reduction of the resolution (the minimum feature size that can be resolved) leads to making resolution to be higher than that of each of existing solid-state image-taking apparatuses, even in the case where the size of each of pixels included in a solid-state image-taking apparatus according to this embodiment is the same as the size of each of pixels included in the existing solid-state image-taking apparatus.

Accordingly, it is possible to obtain images of a sufficiently high resolution in accordance with minuteness of individual pixels beyond the limitation in increase of resolution due to a diffraction limit and aberration of the imaging lens 11.

Further, regardless of the F-value of the imaging lens 11, it is possible to realize a high resolution.

According to the configuration of this embodiment, the concave surface layer 32 of a large Abbe number is laminated on the convex surface layer 31 of a small Abbe number. Providing such a configuration makes a wavelength dispersion of the convex surface layer 31, which is an upper layer, to be smaller, and makes a wavelength dispersion of the concave surface layer 32, which is a higher layer, to be larger. By laminating these two layers 31 and 32, which have wavelength dispersions different from each other, chromatic aberration occurring in each of the layers is cancelled each other, and thus, it is possible to reduce chromatic aberration of the whole of the embedded layer 14 including the layers 31 and 32.

In addition, it is not necessary to form the embedded layer, as shown in FIG. 11, so as to cause the plurality of layers having wavelength dispersions different from one another to be mutually attached closely.

For example, it is possible to form the plurality of layers, which have wavelength dispersions different from one another, between the imaging lens and the chip of the solid-state image-taking device so as to have spaces interposed between the plurality of layers. In such a configuration as described above, in the same manner as or in a manner similar to that of the configuration shown in FIG. 11, it is possible to obtain an effect in which the chromatic aberration is reduced.

6. An Example of a Configuration of a Circuit

Various kinds of solid-state image-taking devices, including CCD solid-state image-taking devices (CCD image sensors) or CMOS type solid-state image-taking devices (CMOS image sensors), can be applied to embodiments according to the present invention.

An example of a configuration of a circuit for a solid-state image-taking device, to which embodiments of the present invention are applied, will be described below.

Figure 13:
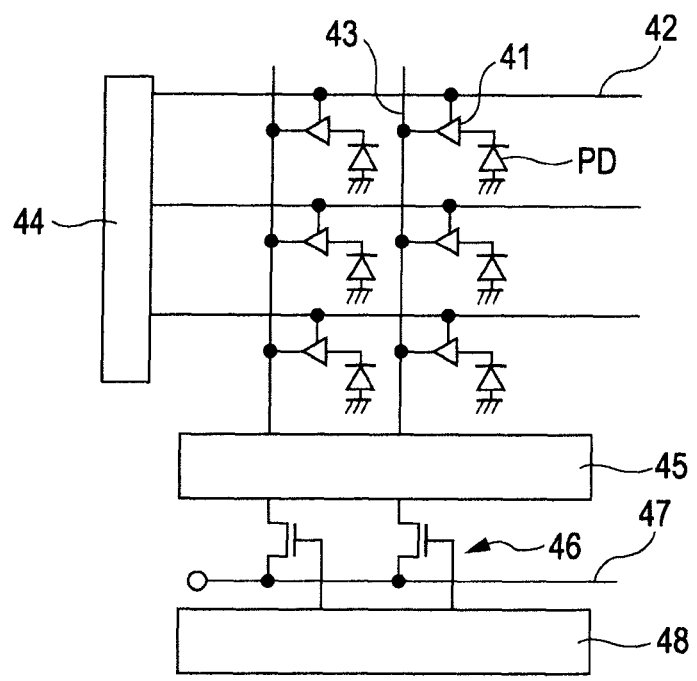
FIG. 13 is a diagram illustrating an example of a circuit configuration of a CMOS type solid-state image-taking device according to embodiments of the present invention.

An example of a configuration of a circuit for the CMOS type solid-state image-taking devices (CMOS image sensors), to which embodiments of the present invention are applied, is shown in FIG. 13.

As shown in FIG. 13, each of pixels includes a photodiode PD of a light receiver, and a cell amplifier 41. The cell amplifier 41 of each pixel is connected to one of vertical signal lines 42 and one of horizontal signal lines 43.

The vertical signal lines 42 are connected to a vertical shift-register 44.

Each of the horizontal signal lines 43 is connected to a horizontal output line 47 via a noise cancelling circuit 45 and a horizontal selection transistor 46. A gate node of a horizontal selection transistor 46 is connected to a horizontal sift-resister 48.

Each of the pixels is driven by the vertical shift-register 44 and the horizontal shift-register 48, and signal charges stored in the pixel are converted into a voltage signal, and the resultant voltage signal is read out.

Figure 14:
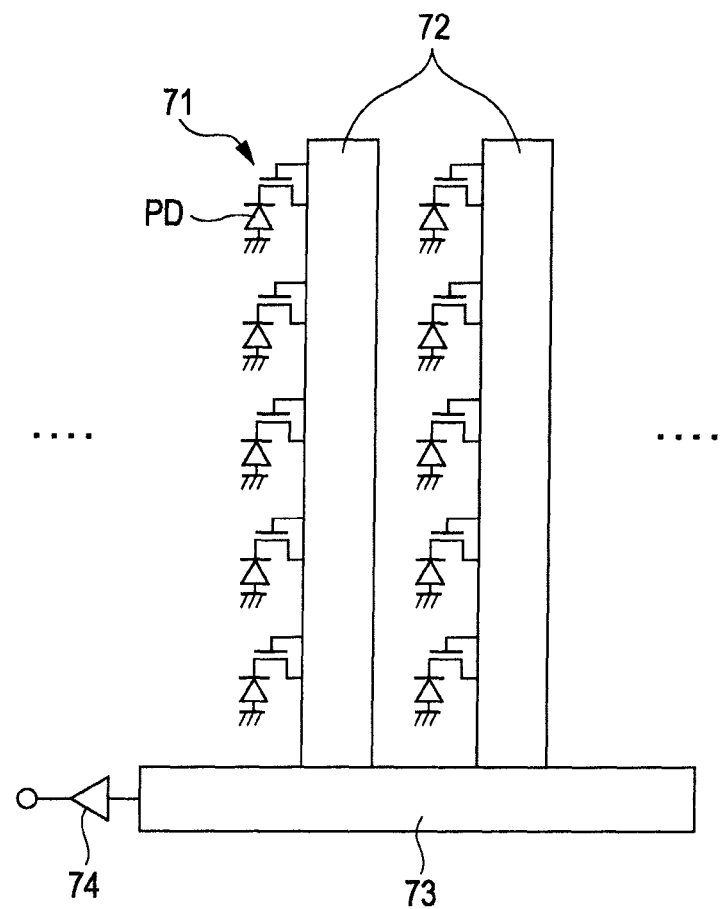
FIG. 14 is a diagram illustrating an example of a circuit configuration of a CCD type solid-state image-taking device according to embodiments of the present invention.

An example of a configuration of a circuit for a CCD solid-state image-taking device (CCD image sensor), to which embodiments of the present invention are applied, is shown in FIG. 14.

As shown in FIG. 14, each of pixels includes a photodiode PD of a light receiver, and a reading-out transistor 71. A vertical CCD transfer register 72 is provided parallel to each of rows of pixels, and the reading-out transistor 71 included in each pixel is connected to a vertical CCD transfer register 72, which is provided for each row of pixels. A terminal portion of each of the vertical CCD transfer registers 72 is connected to a horizontal CCD transfer register 73. A terminal portion of the horizontal CCD transfer register 73 is connected to an output amplifier 74. This circuit configuration is used for a so-called interline transfer (IT) type CCD solid-state image-taking device.

Through the reading-out transistor 71, the vertical CCD transfer register 72 and the horizontal CCD transfer register 73, signal charges stored in each pixel are transferred, and outputted through the output amplifier 74.

Further, embodiments according to the present invention can be applied to not only the circuit configurations shown in FIGS. 13 and 14, but also different circuit configurations of solid-state image-taking devices.

7. An Example of a Modified Embodiment of a Solid-State Image-Taking Apparatus According to the Present Invention In the above-described embodiments, configurations, in which a chip of a solid-state image-taking device corresponds to an imaging lens, have been described. However, embodiments according to the present invention can be applied to a configuration in which a plurality of chips, each incorporating a solid-state image-taking device, correspond to an imaging lens. That is, embodiments according to the present invention can be applied to a configuration in which three chips, each incorporating a solid-state image-taking device, are used, that is, a configuration used in a so-called 3-CCD scheme and the like.

In the case where embodiments according to the present invention are applied to a configuration in which a plurality of chips each incorporating a solid-state image-taking device correspond to an imaging lens, a solid-state image-taking apparatus according to embodiments according to the present invention is configured to include a material of a refraction index larger than "1", which is provided in each of light paths between the chips and the corresponding imaging lens. In the case where the material of a refraction index larger than "1" is allocated at the imaging lens side of a point from which a light path towards the plurality of chips branches, it is necessary to provide only one material of a refraction index larger than "1". In contrast, in the case where the material of a refraction index larger than "1" is allocated at the chip side of a point from which a light path towards the plurality of chips branches, it is necessary to provide a plurality of materials of a refraction index larger than "1", the number of which is the same as that of the chips.

In the above-described fourth embodiment, the chromatic aberration is corrected by providing a plurality of layers having wavelength dispersions different from one another, however, it is possible to correct the chromatic aberration by using other methods.

For example, in order to reduce misalignments of colors with respect to a red color, a green color and a blue color, the misalignments of colors occurring due to chromatic aberration, corrections may be made by the method of signal processing.

Generally, the chromatic aberration occurs due to phenomena in which light rays each having a short wavelength are focused into an image at the front side of an imaging system lens and light rays each having a long wavelength are focused into an image at the back side of an imaging system lens.

Therefore, for example, in the case where, in the direction to an object, a position, at which an image of the blue color B is focused, is shifted to the direction outer from a position at which an image of the green color G is focused, and a position, at which an image of the red color R is focused, is shifted to the direction inner therefrom, the blue color having a wavelength larger than the wavelength of the green color, the red color having a wavelength smaller than the wavelength of the green color, signal processing may be performed so that the position at which an image of the blue color B is focused and the position at which an image of the red color R is focused can be aligned to the position at which an image of the green color is focused, by reducing the size of the image of the blue color B and enlarging the size of the image of the red color R.

8. A Camera to which Embodiments According to the Present Invention are Applied

A camera according to an embodiment of the present invention is configured to include a solid-state image-taking apparatus according to the above-described embodiments of the present invention. Examples of such a camera according to an embodiment of the present invention are steel cameras, video cameras, mobile devices each having a camera function and the like.

Some of embodiments of a camera according to an embodiment of the present invention will be hereinafter described.

Figure 15:
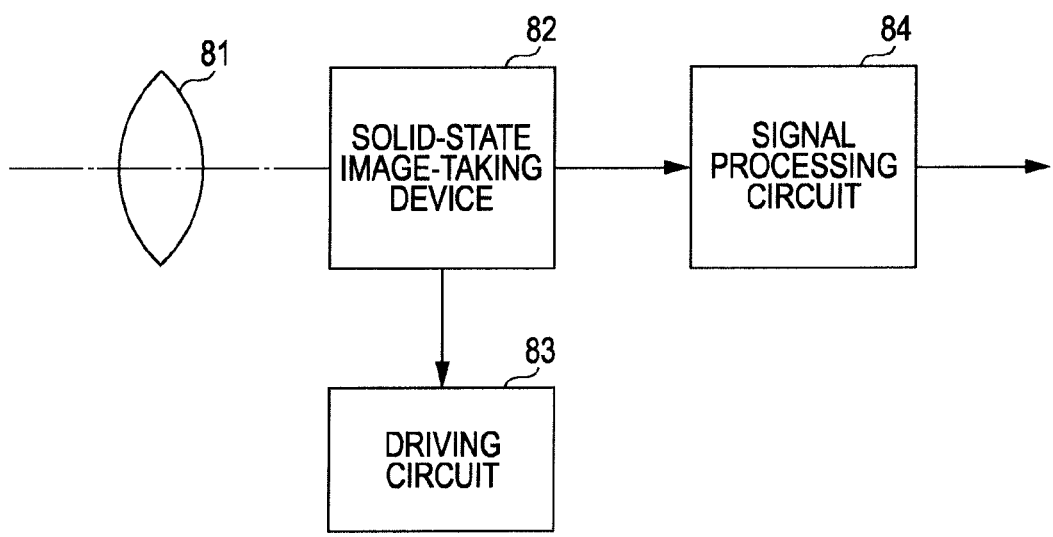
FIG. 15 is a schematic diagram (a block diagram) of a configuration of a camera according to an embodiment of the present invention.

A schematic diagram (a block diagram) of a configuration of a camera according to an embodiment of the present invention is shown in FIG. 15.

A camera according to an embodiment of the present invention is configured to include an optical system (a imaging lens) 81, a solid-state image-taking device 82, a driving circuit 83 and a signal processing circuit 84. The solid-state image-taking device 82 is a CCD solid-state image-taking device, a CMOS type solid-state image-taking device, or the like.

The optical system (imaging lens) 81 focuses image light from an object (incoming light) into an image on a image-taking surface of the solid-state image-taking device 82. This operation causes light receivers (photodiodes) included in the solid-state image-taking device 82 to store therein signal charges during a predetermined period of time. The driving circuit 83 performs control of driving operations, which are performed by the solid-state image-taking device 82, such as a storage operation, a reading-out operation and the like regarding the signal charges. The signal processing circuit 84 performs various signal processes regarding signals outputted from the solid-state image-taking device 82, and outputs signals subjected to the signal processing. This embodiment includes an embodiment of a camera module incorporating therein the optical system (imaging lens) 81, the solid-state image-taking device 82, the driving circuit 83 and the signal processing circuit 84.

A camera according to this embodiment is configured to include the imaging lens 81 and the solid-state image-taking device (chip) 82, and further, in a space interposed between them, a material of a refraction index larger than that of the space, such as the above-described embedded layer 14.

Figure 16:
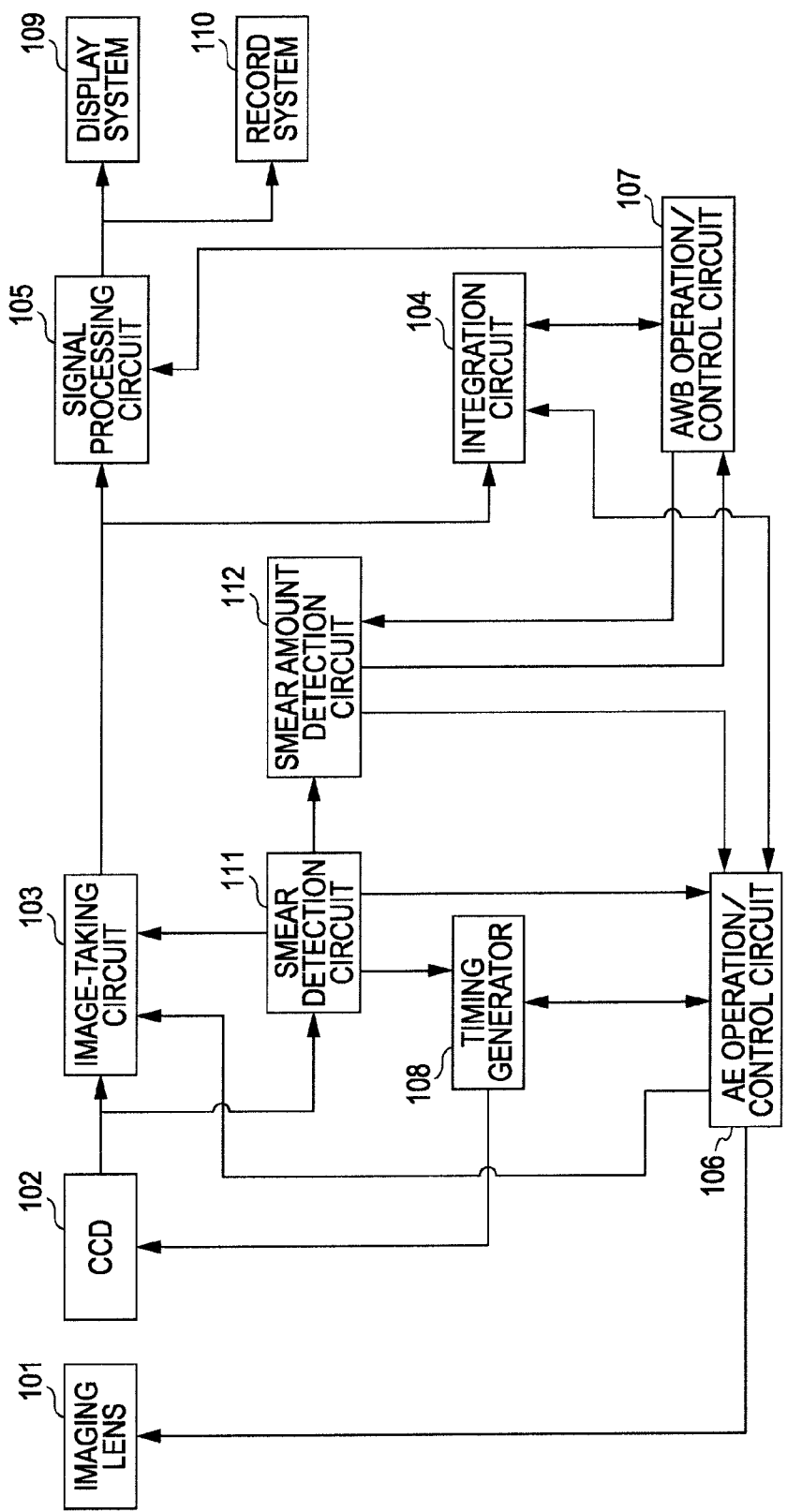
FIG. 16 is a schematic diagram (a block diagram) of a configuration of a camera according to another embodiment of the present invention.

A schematic diagram (a block diagram) of a configuration of a camera according to another embodiment is shown in FIG. 16. In addition, in a camera according to this embodiment, a CCD solid-state image-taking device is used as the solid-state image-taking device.

This camera includes an imaging lens 101, a CCD 102, a image-taking circuit 103, an integration circuit 104, a signal processing circuit 105, an automatic exposure adjustment (AE) operation/control circuit 106, an automatic white balance (AWB) operation/control circuit 107, and a timing generator 108. Moreover, the camera includes a display system 109, a record system 110, a smear detection circuit 111, and a smear amount detection circuit 112.

Between individual sections shown in FIG. 16, signals are supplied as described below.

Taken image signals from the CCD (the CCD solid-state image-taking device) 102 are supplied to the image-taking circuit 103.

The image-taking circuit 103 includes a correlated double sample (CDS) circuit, an automatic gain controller (AGC), an A/D converter and the like, which are omitted from illustration. Signals (image signals) outputted from the image-taking circuit 103 are supplied to the signal processing circuit 105.

Further, the taken image signals from the CCD 102 are also supplied to the smear detection circuit 111, where smear is detected, and smear detection signals from the smear detection circuit 111 are supplied to the smear amount detection circuit 112, and there, an amount of smear is calculated. The smear detection signals from the smear detection circuit 111 are supplied to the timing generator 108 and the AE operation/control circuit 106. AE control signals from the AE operation/control circuit 106 are supplied to the imaging lens 101 and the image-taking circuit 103. Control signals from the AE operation/control circuit 106 are supplied to the timing generator 108, where various timing signals are generated and supplied to the CCD 102 and the AE operation/control circuit 106.

Output signals from the image-taking circuit 103 are supplied to the integration circuit 104, and output signals resulting from the integration are supplied to the AWB operation/control circuit 107. Control signals from the AWB operation/control circuit 107 are supplied to the signal processing circuit 105, the integration circuit 104 and the smear amount detection circuit 112. Signals regarding a detected amount of smear, which are outputted from the smear amount detection circuit 112, are supplied to the AWB operation/control circuit 107. Signals resulting from the integration outputted from the integration circuit 104 are supplied to the AE operation/control circuit 106, and further, control signals from the AE operation/control circuit 106 are supplied to the integration circuit 104.

Image signals from the signal processing circuit 105 are supplied to the display system 109, such as a liquid crystal display device (LCD), where images are displayed, and further, the image signals are supplied to the record system 110, where the image signals are recorded into a external recording medium.

Hereinafter, operations performed by individual sections of a camera, which are shown in FIG. 16, will be described more specifically.

The integration circuit 104 generates a signal corresponding to an automatic exposure adjustment integration value, which is used for performing an automatic exposure adjustment (AE) in accordance with the brightness of an object, and supplies this signal to the AE operation/control circuit 106.

Moreover, the integration circuit 104 generates a signal corresponding to an automatic white-balance control integration value, which is used for performing automatic white-balance control in accordance with color information related to an object, and supplies this signal to the AWB operation/control circuit 107.

The AE operation/control circuit 106 performs processing in synchronization with timing signals supplied from the timing generator 108. Further, the AE operation/control circuit 106 performs control of the value of a lens-aperture which is set by a lens-aperture setting section included in the imaging lens 101, and also performs control of an electronic shutter speed of an electronic shutter included in the CCD 102 so that images each having appropriate brightness and an appropriate amount of exposure can be recorded by the record system 110.

Further, the AE operation/control circuit 106 performs gain control of an AGC circuit included in the image-taking circuit 103, and performs control of integration operations which are performed by the integration circuit 104.

The AWB operation/control circuit 107 performs control of the gains of red (R) and blue (B) signals, which are processed by the signal processing circuit 105, so that images each having an appropriate white-balance can be recorded by the record system 110.

The smear detection circuit 111 is configured to detect smear, in the case where the level of signals outputted to pixels located within a frame by which smear is detected, which are provided in an optical black area of a light receiving surface of the CCD solid-state image-taking device 102, falls within a range between predetermined threshold values. In the case where the level of signals does not fall within the range between predetermined threshold values, it is determined that the smear is not occurring. Once the smear is detected, the smear amount detection circuit 112 is caused to enter an operation condition. When the smear is not detected, the smear amount detection circuit 112 is not caused to enter an operation condition.

A camera according to this embodiment is configured to include the imaging lens 101 and the CCD solid-state image-taking device (chip) 102, and further, in a space interposed between them, a material of a refraction index larger than that of the space, such as the above-described embedded layer 14.

Figure 17:
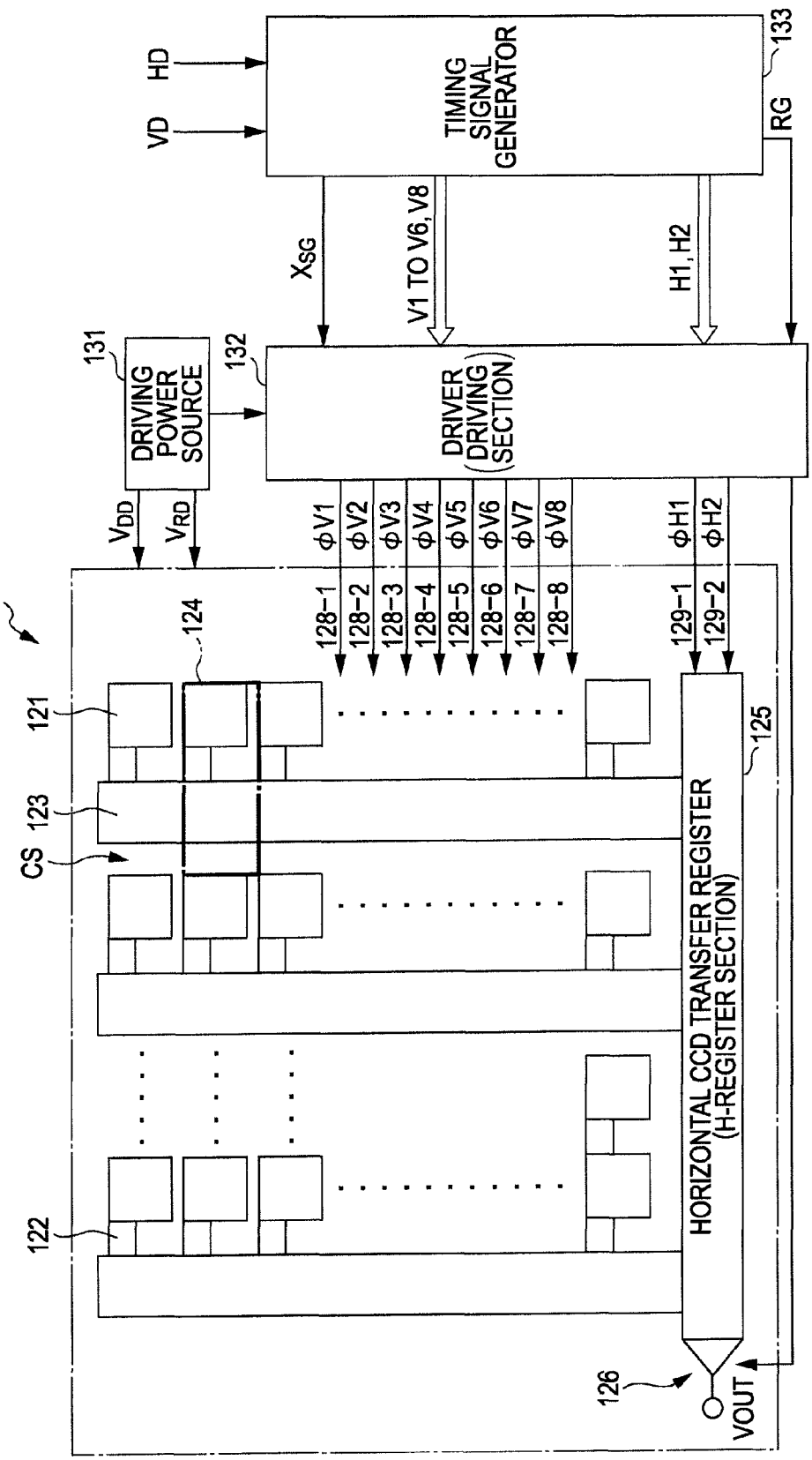
FIG. 17 is a schematic diagram (a block diagram) of a configuration of a camera according to further another embodiment of the present invention.

A schematic diagram (a block diagram) of a configuration of a camera according to further another embodiment is shown in FIG. 17. In addition, a CCD solid-state image-taking device is also used in a camera according to this embodiment as a solid-state image-taking device. In addition, in FIG. 17, an optical system, such as an imaging lens, is omitted from illustration.

This camera is configured to include a CCD solid-state image-taking device 120, and further, a driving power source 131, a driver 132, and a timing signal generator 133, which are included in a driving control section configured to perform driving control of the CCD solid-state image-taking device 120.

In the CCD solid-state image-taking device 120, a large number of light receivers 121 each including a photodiode PD are arranged in a two-dimensional matrix. A vertical CCD transfer register 123 is formed in parallel with each row of light receivers 121. Between each of light receivers 121 and the corresponding vertical CCD transfer register 123, a reading-out gate section 122, which is configured to read out signal charges stored in the light receiver 121, is formed. A terminal of the vertical CCD transfer register 123 is connected to a horizontal CCD transfer register 125.

A unit cell (pixel) 124 is configured to include the receiver 121, the reading-out gate section 122 and the vertical CCD transfer register 123. Further, in a boundary portion of each unit cell 124, a channel stop CS is provided.

Further, in this embodiment, the CCD solid-state image-taking device 120 employing an interline transfer (IT) method is configured to be driven by six-phase pulses or eight-phase pulses.

In FIG. 17, a drain voltage $V_{DD}$ and a reset drain voltage $V_{RD}$ from the driving power source 131 are supplied to the CCD solid-state image-taking device 120, and a predetermined voltage is also supplied to the driver 132.

Further, the vertical CCD transfer register 123 includes a plurality (six or eight per a unit cell, in this example) of vertical transfer electrodes 128 (128-1 to 128-6 or 128-1 to 128-8), each corresponding to one of the six-phase driving pulses or one of the eight-phase driving pulses.

In this camera, signal charges stored in the light receiver 121 of the CCD solid-state image-taking device 120 are read out into the vertical CCD transfer register 123 by supplying the reading-out gate section 122 with a driving pulse corresponding to a reading-out pulse $X_{SG}$. The vertical CCD transfer resister 123 is transfer-driven by driving pulses φV1 to φV6 (φV8) which are generated on the basis of six-phase (eight-phase) vertical transfer clocks V1 to V6 (V8). Further, the vertical CCD transfer register 123 sequentially transfers the read-out signal charges in the vertical direction by each part of the read-out signals, corresponding to a duration time while one scanning line is valid (i.e., a duration time for one line of the read-out signals), the duration time being a part within a horizontal blanking period.

Further, the horizontal CCD transfer register 125 is transfer-driven by driving pulses φH1 and φH2 which are generated on the basis of, for example, two-phase transfer clocks H1 and H2. Further, the horizontal CCD transfer register 125 sequentially transfers a line of signal charges, which have been transferred from the plurality of vertical CCD transfer registers 123, in the horizontal direction during a horizontal scanning period subsequent to the horizontal blanking period. For this operation, a plurality of (two) horizontal transfer electrodes 129 (129-1 and 129-2) corresponding to the two-phase driving clocks are provided.

To the transfer destination side of terminal portions of the CCD transfer register 125, for example, an electric charge/voltage convertor 126 configured to include a floating-diffusion-amp (FDA) is connected. This electric charge/voltage convertor 126 sequentially converts charge signals, which have been horizontally transferred from the horizontal CCD transfer register 125, into voltage signals, and outputs the resultant voltage signals. The voltage signals are derived as a CCD output (VOUT) in accordance with an amount of light incoming from an object.

Moreover, the timing generator 133 generates various pulse signals, each having two values of an L level and an H level, and the generated pulse signals are used for driving the CCD solid-state image-taking device 120. The driver 132 converts the various pulse signals supplied from the timing generator 133 into driving pulses of a predetermined level, and the converted driving pulses are supplied to the CCD solid-state image-taking device 120.

The timing signal generator 133 generates various signals on the basis of, for example, a horizontal synchronization signal (HD) and a vertical synchronization signal (VD), and supplies the generated signals to the driver 132. That is, the timing signal generator 133 generates the reading-out pulse $X_{SG}$ configured to read out signals charges stored in the light receiving section 121, the vertical transfer clocks V1 to V6 (V8) configured to transfer-drive signal charges in the vertical direction, the horizontal transfer pulses H1 and H2 configured to transfer-drive signal charges in the horizontal direction, a reset pulse RG, and the like.

The driver 132 converts various pulses supplied from the timing signal generator 133 into voltage signals (driving pulses) of a predetermined level or other signals, and supplies the CCD solid-state image-taking device 120 with the converted signals. For example, n-phase vertical transfer clocks V1 to V6 (V8) from the timing signal generator 133 are converted into the driving pulses φV1 to φV6 (φV8) via the driver 132, which are supplied to the corresponding predetermined vertical transfer electrodes 128. In the same manner, two-phase horizontal transfer clocks H1 and H2 are converted into the driving pulses φH1 and φH2 via the driver 132, which are supplied to the corresponding predetermined horizontal transfer electrodes (129-1 and 129-2).

A camera according to this embodiment is configured to include an imaging lens, which is omitted from illustration, and the chip 120 of the CCD solid-state image-taking device, and further, a material of a refraction index larger than that of a space interposed between the imaging lens and the chip, such as the above-described embedded layer 14 or the optical part 16.

In addition, driving controllers (131, 132 and 133) for driving the CCD solid-state image-taking device 120 can be configured to be provided inside the chip 120 of the CCD solid-state image-taking device, or outside the chip of the CCD solid-state image-taking device 120.

The configuration of a camera according to the above-described three embodiments of the present invention may be a configuration combined with those of the above-described first to fourth embodiments of a solid-state image-taking apparatus according to the present invention, or may be configurations of other solid-state image-taking apparatuses.

The configuration of a camera according to the present invention is not limited to the configurations of the embodiments, shown in FIGS. 15 to 17, but can adopt other various configurations.

The present application contains subject matter related to that disclosed in Japanese Priority Patent Application JP 2009-001996 filed in the Japan Patent Office on Jan. 7, 2009, the entire content of which is hereby incorporated by reference.

It should be understood by those skilled in the art that the present invention is not limited to the above-described embodiments, but can adopt other various configurations within the scope not departing from the gist of the present invention.

What is claimed is:

1. A solid-state image-taking apparatus which includes a solid-state image-taking device, the solid-state image-taking apparatus comprising:
   a chip solid-state image-taking device;
   an imaging lens configured to focus incoming light into an image on the chip solid-state image-taking device; and
   a material of a refraction index larger than 1, which is arranged between the chip and the imaging lens and is laminated on an uppermost layer of the chip, and the material of a refraction index larger than 1 has a depth that is larger than or equal to a focal depth of the imaging lens.

2. The solid-state image-taking apparatus according to claim 1, wherein the material of a refraction index larger than 1 is configured to occupy the whole of a space between the chip and the imaging lens.

3. The solid-state image-taking apparatus according to claim 1, wherein the material of a refraction index larger than 1 is configured to include an optical part having a planer portion and a convex curved-surface-shaped portion, and the convex curved-surface-shaped portion of the optical part is configured to be contacted with the surface of the highest layer of the chip.

4. The solid-state image-taking apparatus according to claim 3, wherein the width of a contact portion between the convex curved-surface-shaped portion of the optical part and the highest layer of the chip is less than or equal to 800 nm.

5. The solid-state image-taking apparatus according to claim 3, further comprising:
   a waveguide path which is formed between the convex curved-surface-shaped portion of the optical part and a light receiver included in each of pixels of the solid-state image-taking device.

6. The solid-state image-taking apparatus according to any of claims 1 or 2-5, wherein the material of a refraction index larger than 1 has an Abbe number larger than or equal to 50.

7. The solid-state image-taking apparatus according to any of claims 1 or 2-5, wherein a plurality of materials having wavelengths different from one another are provided as the material of a refraction index larger than 1.

8. The solid-state image-taking apparatus according to claim 1, wherein a reflection prevention film is provided on the surface of the imaging lens side of the material of a refraction index larger than 1, and the reflection prevention film has a refraction index of an intermediate value between 1 and a refraction index of the material of a refraction index larger than 1.

9. A manufacturing method of a solid-state image-taking apparatus including a chip of a solid-state image-taking device and an imaging lens configured to focus incoming light into an image on the solid-state image-taking device, the manufacturing method comprising:
   forming a material of a refraction index larger than 1 between the chip and the imaging lens and being laminated on an uppermost layer of the chip, and the material of a refraction index larger than 1 has a depth that is larger than or equal to a focal depth of the imaging lens.

10. The manufacturing method of a solid-state image-taking apparatus, according to claim 9, wherein an optical part is produced by molding the material of a refraction index larger than 1, and the optical part is bonded with the surface of the highest layer of the chip.

11. A camera which includes a solid-state image-taking apparatus including a solid-state image-taking device and is used for taking an image, the camera comprising:
- a chip of the solid-state image-taking device;
- an imaging lens configured to focus incoming light into an image on the solid-state image-taking device; and
- a material of a refraction index larger than 1, which is arranged between the chip and the imaging lens and is laminated on an uppermost layer of the chip, and the material of a refraction index larger than 1 has a depth that is larger than or equal to a focal depth of the imaging lens.

* * * * *